(12) United States Patent
Im

(10) Patent No.: US 12,324,142 B2
(45) Date of Patent: Jun. 3, 2025

(54) SEMICONDUCTOR DEVICE INCLUDING WRITE TRANSISTOR AND READ TRANSISTOR HAVING READ WORD LINE AND READ BIT LINE AT OPPOSITE ENDS OF READ CHANNEL LAYER

(71) Applicant: SK hynix Inc., Icheon-si (KR)

(72) Inventor: Mir Im, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 464 days.

(21) Appl. No.: 17/825,133

(22) Filed: May 26, 2022

(65) Prior Publication Data

US 2023/0122541 A1   Apr. 20, 2023

(30) Foreign Application Priority Data

Oct. 18, 2021   (KR) .......................... 10-2021-0138870

(51) Int. Cl.
*H10B 12/00*   (2023.01)
(52) U.S. Cl.
CPC ............. *H10B 12/20* (2023.02); *H10B 12/50* (2023.02)

(58) Field of Classification Search
CPC ............................... H10B 12/20; H10B 12/50
See application file for complete search history.

(56) References Cited

U.S. PATENT DOCUMENTS

| | | | |
|---|---|---|---|
| 2008/0285325 A1* | 11/2008 | Kameshiro | G11C 11/405 365/51 |
| 2018/0301454 A1 | 10/2018 | Mathew et al. | |
| 2020/0126991 A1* | 4/2020 | Yamazaki | G11C 5/02 |
| 2024/0244819 A1* | 7/2024 | Lai | H10B 12/01 |

* cited by examiner

*Primary Examiner* — Michael Jung

(57) ABSTRACT

A semiconductor device includes a memory cell including a write transistor and a read transistor that are electrically connected to each other. The write transistor includes a write bit line disposed over a substrate, a write channel structure disposed on the write bit line and extending in a direction perpendicular to a surface of the substrate on the write bit line, a write gate dielectric layer disposed on a side surface of the write channel structure, and a write word line disposed on the write gate dielectric layer. The read transistor includes a read gate electrode layer disposed on the write channel structure, a read gate dielectric layer disposed on the read gate electrode layer, a read channel layer disposed on the read gate dielectric layer, and a read word line and a read bit line that are disposed at opposite ends of the read channel layer.

27 Claims, 57 Drawing Sheets

SEMICONDUCTOR DEVICE INCLUDING WRITE TRANSISTOR AND READ TRANSISTOR HAVING READ WORD LINE AND READ BIT LINE AT OPPOSITE ENDS OF READ CHANNEL LAYER

CROSS-REFERENCE TO RELATED APPLICATIONS

The present application claims priority under 35 U.S.C. § 119 (a) to Korean Application No. 10-2021-0138870, filed on Oct. 18, 2021 in the Korean Intellectual Property Office, which is incorporated herein by reference in its entirety.

BACKGROUND

1. Technical Field

The present disclosure generally relates to a semiconductor device, and more particularly, to a semiconductor device including a write transistor and a read transistor.

2. Related Art

As the size of the semiconductor memory devices continues to decrease, various studies are being conducted to increase the density of memory cells in such devices.

In a conventional case, memory cells employ a one transistor to one capacitor (1T-1C) structure in which one transistor and one capacitor are electrically connected to each other. Recently, research has been actively focused on the structure of a memory cell that realizes a higher cell density by reducing the size of the capacitor that occupies a relatively large space in the memory cell or by omitting the capacitor.

SUMMARY

A semiconductor device according to an embodiment of the present disclosure includes a memory cell including a write transistor and a read transistor that are electrically connected to each other. The write transistor includes a bit line disposed over a substrate, a write channel structure disposed on the write bit line and extending in a direction perpendicular to a surface of the substrate, a write gate dielectric layer disposed on a side surface of the write channel structure, and a write word line disposed on the write gate dielectric layer. The read transistor includes a read gate electrode layer disposed on the write channel structure, a read gate dielectric layer disposed on the read gate electrode layer, a read channel layer disposed on the read gate dielectric layer, and a read word line and a read bit line that are disposed at opposite ends of the read channel layer.

A semiconductor device according to another embodiment of the present disclosure includes a first memory cell including a write transistor and a read transistor and a second memory cell including a write transistor and a read transistor. Each of the write transistors of the first and second memory cells includes a bit line disposed over a substrate, a write channel structure extending in a direction perpendicular to a surface of the substrate on the write bit line, a write gate dielectric layer disposed on a side surface of the write channel structure, and a write word line disposed on the write gate dielectric layer. Each of the read transistors of the first and second memory cells includes a read gate electrode layer disposed on the write channel structure, a read gate dielectric layer disposed on the read gate electrode layer, a read channel layer disposed on the read gate dielectric layer, and a read word line and a read bit line that are respectively disposed at opposite ends of the read channel layer. The second memory cell is disposed over the first memory cell with respect to a surface of a substrate.

In a method of manufacturing a semiconductor device according to another embodiment of the present disclosure, a write bit line extending in a first direction parallel to a surface of a substrate is formed over the substrate. A write channel structure extending in a second direction perpendicular to the surface of the substrate is formed over the write bit line. A write gate dielectric layer disposed on a side surface of the write channel structure is formed. A write word line disposed on the write gate dielectric layer and extending in a third direction parallel to the surface of the substrate is formed over the write bit line. A read gate electrode layer, a read gate dielectric layer, and a read channel layer are sequentially formed on an upper surface of the write channel structure. A read word line and a read bit line extending in a fourth direction parallel to the surface of the substrate are formed at opposing ends of the read channel layer.

A semiconductor device according to another embodiment of the present disclosure includes a substrate, and a memory cell including a write transistor and a read transistor disposed over the substrate. The write transistor includes a write bit line extending in a first direction parallel to a surface of the substrate, a write channel structure extending in a second direction perpendicular to the surface of the substrate on the write bit line, a write gate dielectric layer disposed on a side surface of the write channel structure, and a write word line disposed to contact the gate dielectric layer and extending in a third direction parallel to the surface of the substrate. The read transistor includes a read gate electrode layer disposed over the write channel structure to be electrically connected to the write channel structure, a read gate dielectric layer disposed on the read gate electrode layer, a read channel layer disposed on the read gate dielectric layer, and a read word line and a read bit line that are respectively disposed at opposite ends of the read channel layer and that extend in a fourth direction parallel to the surface of the substrate. The fourth direction is parallel to the first direction or the third direction. The write channel structure, the read gate electrode layer, the read gate dielectric layer, and the read channel layer are disposed to overlap with each other along the second direction.

BRIEF DESCRIPTION OF THE DRAWINGS

FIGS. 7A to 21A are cross-sectional views schematically illustrating a method of manufacturing a semiconductor device according to an embodiment of the present disclosure.

FIGS. 7B to 21B are plan views schematically illustrating a method of manufacturing a semiconductor device according to an embodiment of the present disclosure.

FIGS. 7C to 15C are cross-sectional views schematically illustrating structures of FIGS. 7A to 15A taken along a line A-A' on an x-y plane.

FIGS. 18C to 21C are cross-sectional views illustrating the structures of FIGS. 18A to 21A taken along a line D-D' on an x-y plane.

DETAILED DESCRIPTION

Figure 1:
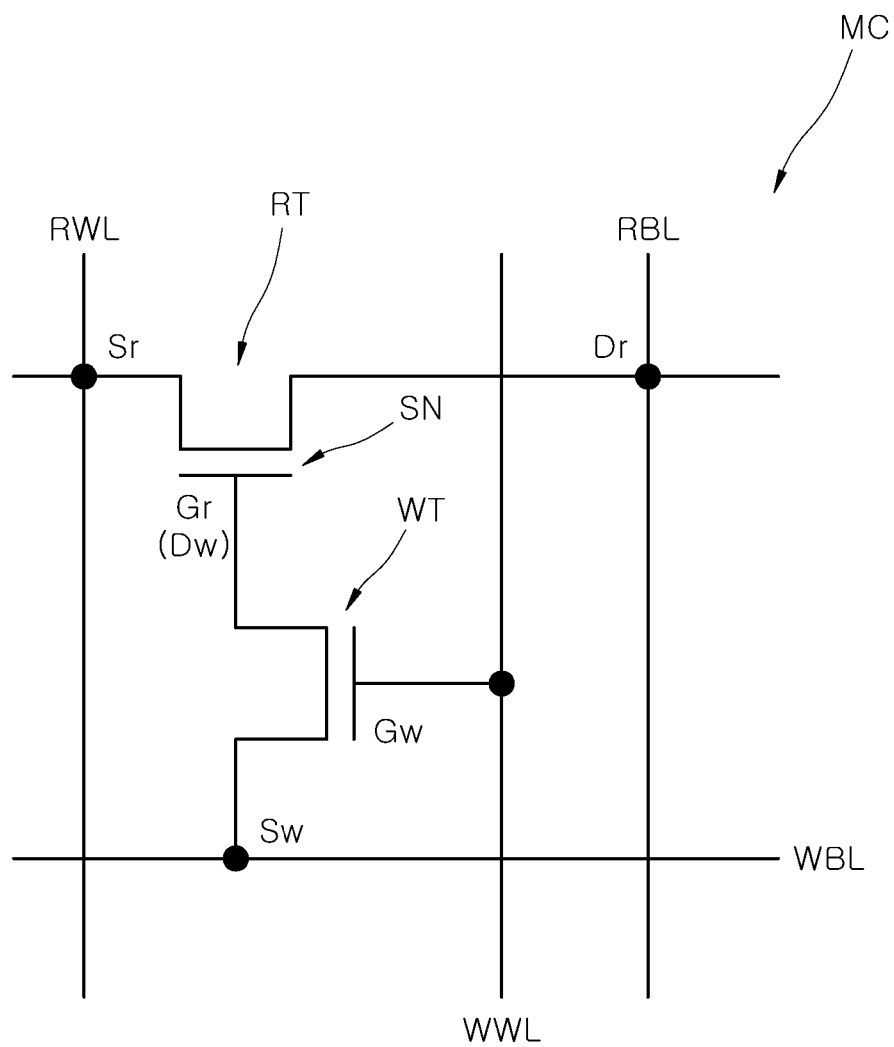
FIG. 1 is a circuit diagram of a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

FIG. 1 is a circuit diagram of a semiconductor device according to an embodiment of the present disclosure. Referring to FIG. 1, a semiconductor device 1 may include a memory cell MC. The memory cell MC may be, for example, a DRAM cell without a capacitor. The memory cell MC may include a write transistor WT and a read transistor RT that are electrically connected to each other.

The write transistor WT may include a write gate electrode Gw connected to a write word line WWL, and a write source electrode Sw connected to a write bit line WBL. The read transistor RT may include a read gate electrode Gr, a read source electrode Sr connected to a read word line RWL, and a read drain electrode Dr connected to a read bit line RBL. A write drain electrode Dw of the write transistor WT may be electrically connected to the read gate electrode Gr of the read transistor RT.

In the memory cell MC of FIG. 1, a gate dielectric layer SN of the read transistor RT may function as a charge storage dielectric layer (i.e., capacitor dielectric layer) storing signal information. In addition, the read gate electrode Gr of the read transistor RT may function as a charge storage electrode layer (i.e., capacitor electrode layer).

In an embodiment, a write operation of the memory cell MC may be performed as follows. The write transistor WT may be turned on or turned off according to a voltage signal applied to the write word line WWL. When the write transistor WT is turned on, an electrical signal of the write bit line WBL may be applied to the read gate electrode Gr of the read transistor RT as a voltage level through the write drain electrode Dw. As an example, when a predetermined positive voltage signal is applied to the write bit line WBL while the write transistor WT is turned on, electric charges are charged in the gate dielectric layer SN and the voltage level of the read gate electrode Gr may increase. After the write transistor WT is turned off, the read gate electrode Gr may maintain the increased voltage level as a voltage of a first level. Accordingly, the memory cell MC may store a voltage state at the first level in the read gate electrode Gr and the charged state of the electric charges in the gate dielectric layer SN as a first signal information. As another example, when a zero voltage of (0 V) is applied to the write bit line WBL while the write transistor WT is turned on, the electric charges stored in the gate dielectric layer SN are discharged to the write bit line WBL and the voltage level of the read gate electrode Gr may be decreased. After the write transistor WT is turned off, the read gate electrode Gr may maintain the decreased voltage level at a second level voltage. Accordingly, the memory cell MC may store the second level voltage state of the read gate electrode Gr and the discharged state of the electric charges in the gate dielectric layer SN as a second signal information.

In an embodiment, a read operation of the memory cell MC may be performed as follows. In a standby state, the voltage levels of the read word line RWL and the read bit line RBL may be maintained at 0 V. When the read operation is performed, the voltage level of the read word line RWL may be increased to a predetermined positive voltage while the voltage level of the read bit line RBL is maintained at 0 V.

When the read gate electrode Gr maintains the voltage of the first level (i.e., when the memory cell MC stores the first signal information), the read transistor RT may be turned on. The voltage level of the read bit line RBL may be increased while the read transistor RT maintains the turned-on state. When the read gate electrode Gr maintains the voltage of the second level (i.e., when the memory cell MC stores the second signal information), the read transistor RT may be in a turned-off state, and the read bit line RBL may maintain a voltage level of 0 V. The memory cell MC may discriminate the signal information stored in the memory cell MC by amplifying the voltage level of the read bit line RBL using a sense amplifier and comparing the amplified voltage level with a reference voltage level.

In various embodiments of the present disclosure, a semiconductor device including a memory cell having the circuit configuration of FIG. 1 is described below. The semiconductor device may have a structure in which write transistors and read transistors of the memory cell are three-dimensionally stacked on a substrate.

Figure 2A:
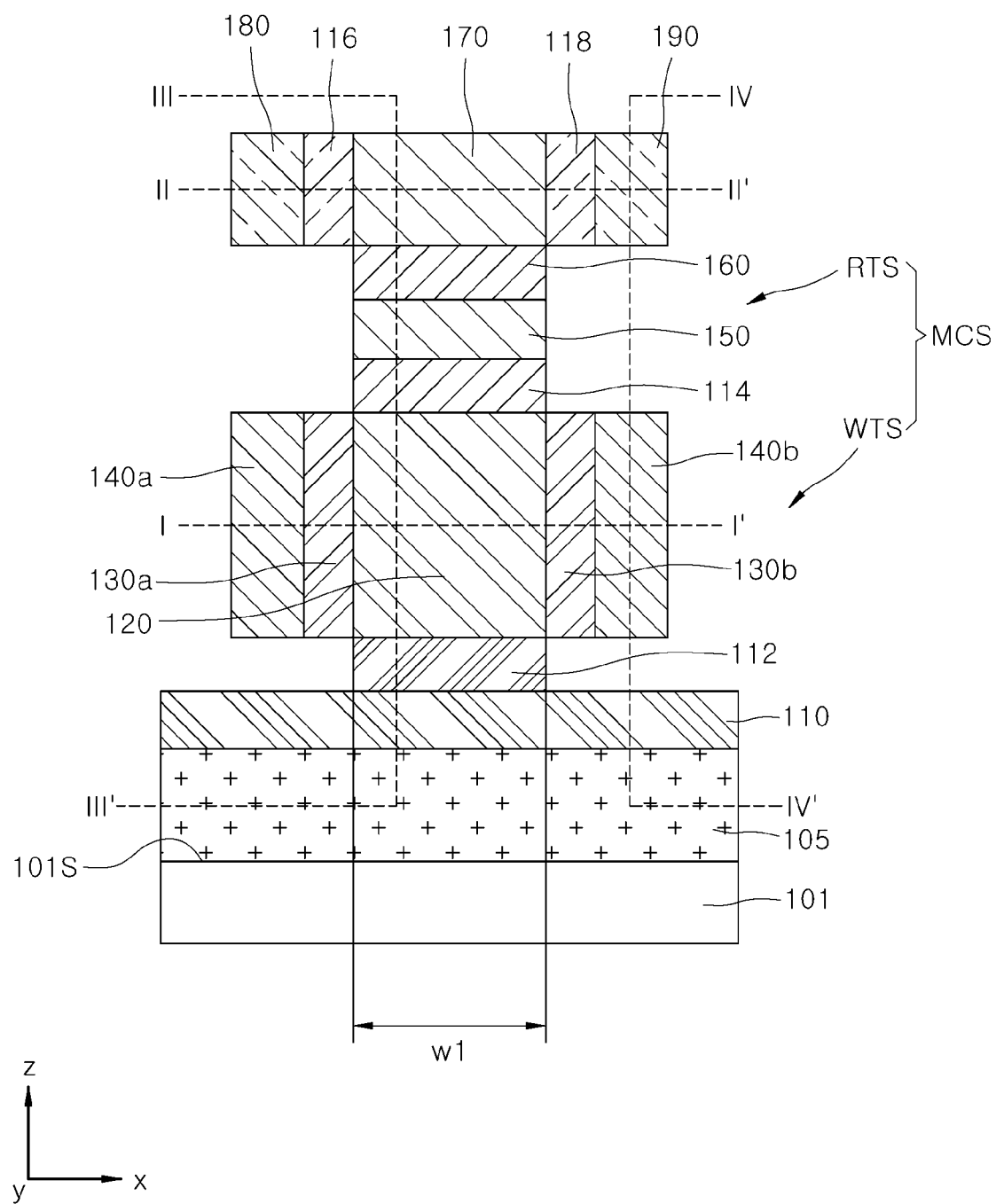
FIG. 2A is a cross-sectional view schematically illustrating a semiconductor device according to an embodiment of the present disclosure.
Figure 2B:
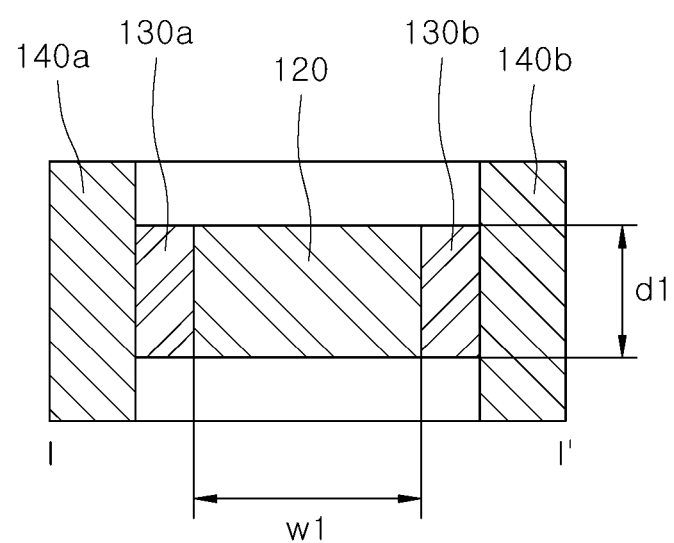
FIG. 2B is a cross-sectional view illustrating a semiconductor device of FIG. 2A taken along a line I-I' on the x-y plane.
Figure 2C:
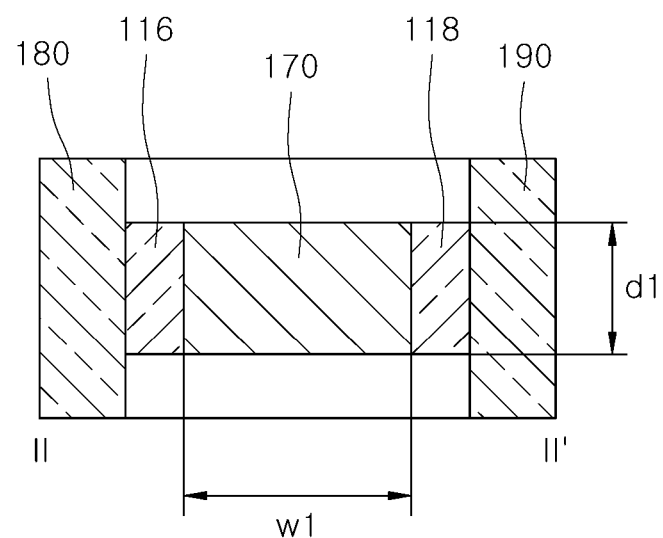
FIG. 2C is a cross-sectional view illustrating a semiconductor device of FIG. 2A taken along a line II-II' on the x-y plane.
Figure 2D:
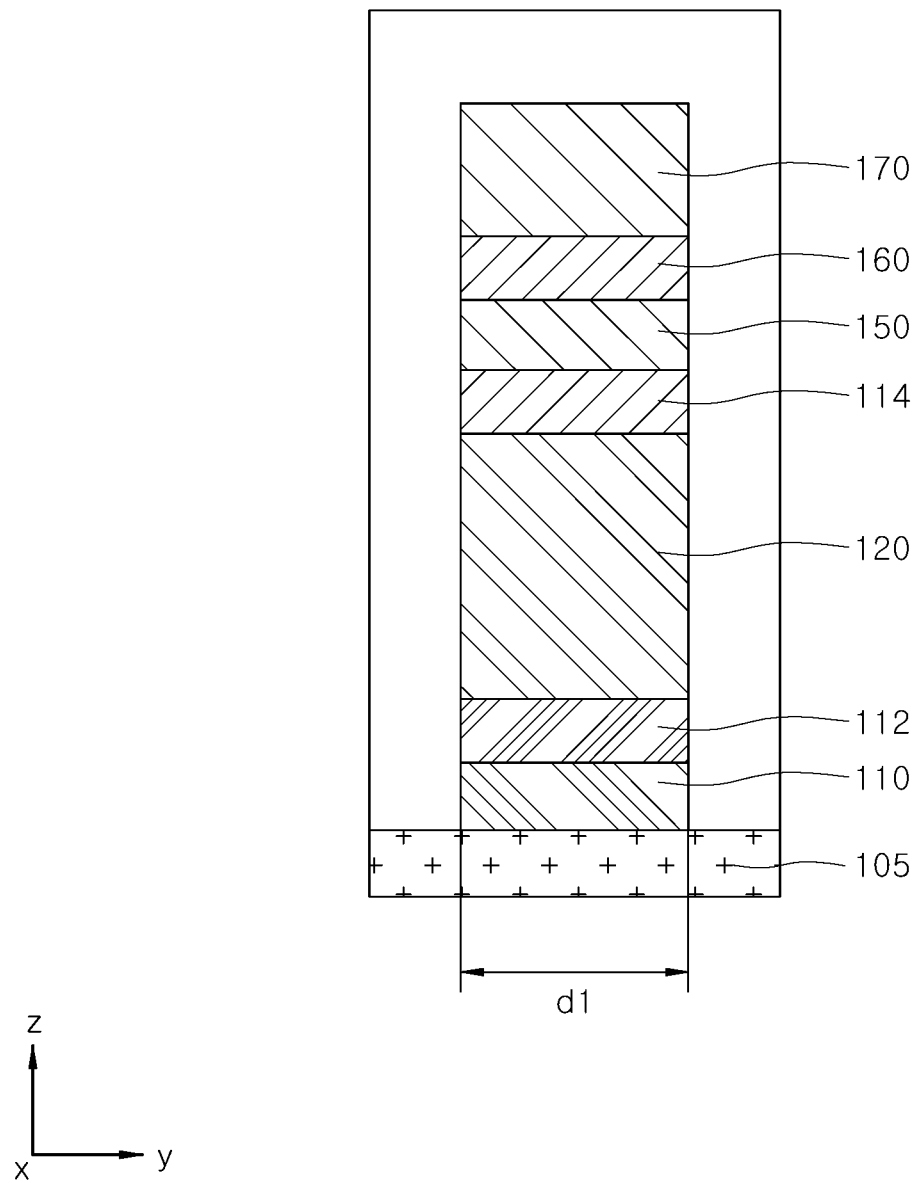
FIG. 2D is a cross-sectional view illustrating a semiconductor device of FIG. 2A taken along a line III-III' on the y-z plane.
Figure 2E:
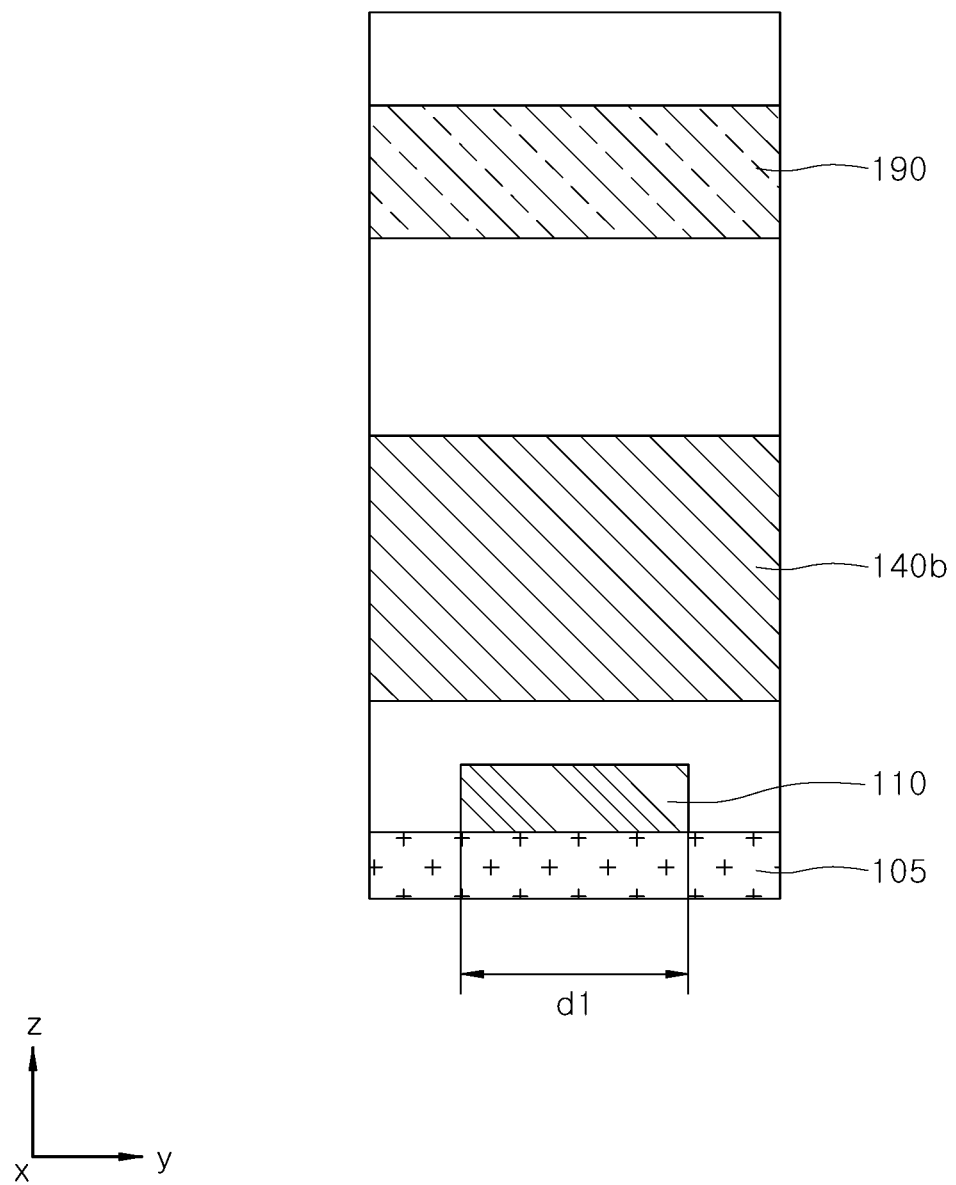
FIG. 2E is a cross-sectional view illustrating a semiconductor device of FIG. 2A taken along a line IV-IV' on the y-z plane.

FIG. 2A is a cross-sectional view schematically illustrating a semiconductor device according to an embodiment of the present disclosure. FIG. 2B is a cross-sectional view illustrating a semiconductor device of FIG. 2A taken along a line I-I' on the x-y plane. FIG. 2C is a cross-sectional view illustrating a semiconductor device of FIG. 2A taken along a line II-II' on the x-y plane. FIG. 2D is a cross-sectional view illustrating a semiconductor device of FIG. 2A taken along a line III-III' on the y-z plane. FIG. 2E is a cross-sectional view illustrating a semiconductor device of FIG. 2A taken along a line IV-IV' on the y-z plane.

Referring to FIGS. 2A to 2E, a semiconductor device 2 may include a memory cell MCS including a write transistor WTS and a read transistor RTS disposed over a substrate 101.

The write transistor WTS may include a write bit line 110 disposed over the substrate 101, a write channel structure 120 disposed over the write bit line 110, write gate dielectric layers 130a and 130b disposed on side surfaces of the write channel structure 120, and write word lines 140a and 140b disposed on side surfaces of the write gate dielectric layers 130a and 130b, respectively.

The read transistor RTS may be disposed over the write transistor WTS. The read transistor RTS may include a read gate electrode layer 150 disposed over the write channel structure 120, a read gate dielectric layer 160 disposed on the read gate electrode layer 150, a read channel layer 170 disposed on the read gate dielectric layer 160, and a read word line 180 and a read bit line 190 respectively disposed at opposite ends of the read channel layer 170. The write channel structure 120 of the write transistor WTS may be electrically connected to the read gate electrode layer 150 of the read transistor RTS.

In addition, the semiconductor device 2 may further include a first contact layer 112 disposed between the write bit line 110 and the write channel structure 120, a second contact layer 114 disposed between the write channel structure 120 and the read gate electrode layer 150, a third contact layer 116 disposed between the read channel layer 170 and the read word line 180, and a fourth contact layer 118 disposed between the read channel layer 170 and the read bit line 190.

Although not illustrated in FIGS. 2A to 2E, the semiconductor device 2 may further include interlayer insulation layers. The interlayer insulation layers may be disposed over the substrate 101 and in spaces between components illustrated in FIGS. 2A to 2E to electrically insulate the illustrated components from each other. The configurations of the interlayer insulation layers may be more clearly described with reference to the drawings illustrating manufacturing methods described later with reference to FIGS. 7A to 21A and FIGS. 7B to 21B.

Referring to FIG. 2A, the substrate 101 may include a semiconductor material. Specifically, the semiconductor material may include silicon (Si), germanium (Ge), gallium arsenide, (GaAs), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof. The substrate 101 may be doped with an n-type or p-type dopant to have conductivity.

A base insulation layer 105 may be disposed on the substrate 101. The base insulation layer may include, for example, oxide, nitride, oxynitride, or a combination of two or more thereof.

The write bit line 110 of the write transistor WTS may be disposed on the base insulation layer 105. The write bit line 110 may be a conductive pattern layer including a line shape. In an embodiment, the write bit line 110 may extend in the x-direction, which is parallel to a surface 101S of the substrate 101. As illustrated in FIGS. 2D and 2E, the write bit line 110 may have a predetermined line width d1 in a y-direction, which is perpendicular to the x-direction.

The write bit line 110 may include a conductive material. The conductive material may include, for example, a semiconductor, metal, conductive metal nitride, conductive metal carbide, conductive metal silicide, or conductive metal oxide. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The write channel structure 120 may be disposed over the write bit line 110. The write channel structure 120 may be electrically connected to the write bit line 110. The write channel structure 120 may extend in a direction (i.e., the z-direction) substantially perpendicular to the surface 101S of the substrate 101.

The write channel structure 120 may have a pillar or pillar-like structure and may have a semiconductive property. Referring to FIGS. 2A, 2B, and 2D, the write channel structure 120 may include a pillar structure with a quadrangular cross-section. The write channel structure 120 may have a predetermined width w1 along the x-direction and a predetermined length d1 along the y-direction. Referring to FIG. 2D, the length of the write channel structure 120 in the y-direction may be the same as the line width d1 of the write bit line 110 in the same direction. In other embodiments, instead of a quadrangular pillar, the pillar structure may have different cross-sectional shapes in, for example, a polygonal pillar, a cylindrical pillar, or an elliptical pillar.

The write channel structure 120 may include, for example, a semiconductor, conductive metal oxide, transition metal chalcogenide, or a combination of two or more thereof. As an example, the semiconductor may include doped silicon (Si). As another example, the conductive metal oxide may include indium oxide ($In_2O_3$), dopant-doped indium oxide ($In_2O_3$), indium gallium zinc oxide ($InGaZnO_4$), zinc oxide (ZnO), indium gallium oxide ($InGaO_3$), or the like. The dopant may include titanium (Ti), tungsten (W), silicon (Si), or a combination of two or more thereof.

The first and second write gate dielectric layers 130a and 130b may be respectively disposed on side surfaces of the write channel structure 120. The first and second write gate dielectric layers 130a and 130b may be disposed to be spaced apart from each other. As an example, in FIG. 2A, the first and second write gate dielectric layers 130a and 130b may be respectively disposed on opposite side surfaces of the write channel structure 120 and spaced apart in the x-direction. The first and second write gate dielectric layers 130a and 130b may be respectively disposed to be in contact with the opposing outer surfaces of the write channel structure 120. Referring to FIG. 2B, each of the first and second write gate dielectric layers 130a and 130b may have a width corresponding to the width d1 of the write channel structure 120.

Each of the first and second write gate dielectric layers 130a and 130b may include, for example, silicon oxide, silicon nitride, silicon oxynitride, aluminum oxide, hafnium oxide, zirconium oxide, or a combination of two or more thereof. The first and second write gate dielectric layers 130a and 130b may have substantially the same length as each other.

The first and second write word lines 140a and 140b may be disposed on the first and second write gate dielectric layers 130a and 130b, respectively. The first and second write word lines 140a and 140b may be conductive pattern layers of a line shape. The first and second write word lines 140a and 140b may be disposed to be parallel to each other.

The first and second write word lines 140a and 140b may be disposed to be in contact with the first and second write gate dielectric layers 130a and 130b, respectively, and be disposed to be spaced apart from the write channel structure 120. In an embodiment, the first and second write word lines 140a and 140b may be disposed to extend in the y-direction parallel to the surface of the substrate 101. Accordingly, the first and second write word lines 140a and 140b may extend in a direction perpendicular to the extension direction of the write bit line 110.

In an embodiment, the first write word line 140a may receive a first gate voltage to form a channel in an inner region of the write channel structure 120, adjacent to the first write gate dielectric layer 130a. The second write word line 140b may receive a second gate voltage to form a channel in an inner region of the write channel structure 120, adjacent to the second write gate dielectric layer 130b.

Although not illustrated, the first and second write word lines 140a and 140b may be electrically connected to each other. That is, the first and second write word lines 140a and 140b may have substantially the same electrical potential. In an embodiment, when operation gate voltages of the same magnitude are applied to the first and second write word lines 140a and 140b, a pair of conductive channels may be formed in the write channel structure 120 along the z-direction, adjacent respectively to the first and second write gate dielectric layers 130a and 130b. As a result, the efficiency of current flow in the z-direction through the conductive channels may be improved.

Each of the first and second write word lines 140a and 140b may include, for example, a conductive material. The conductive material may include, for example, doped semiconductor, metal, conductive metal nitride, conductive metal carbide, conductive metal silicide, conductive metal oxide, or a combination of two or more thereof. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 2A and 2D, the first contact layer 112 may be disposed between the write bit line 110 and the write channel structure 120. The first contact layer 112 may serve to reduce the contact resistance at a junction of the write bit line 110 and the write channel structure 120. A surface area of the first contact layer 112 on the x-y plane parallel to the surface 101S of the substrate 101 may be substantially the same as a cross-sectional area of the write channel structure 120 on the same x-y plane. As an example, the first contact layer 112 may have a width w1 in the x-direction and a length d1 in the y-direction.

The first contact layer 112 may include a conductive material. As an example, the first contact layer 112 may include metal silicide. As another example, the first contact layer 112 may include doped conductive metal oxide, doped transition metal chalcogenide, or a combination of two or more thereof. The first contact layer 112 may include the same material as the write channel structure 120, but may include a dopant at a higher concentration than that in the write channel structure 120. As a result, the first contact layer 112 may have higher electrical conductivity than the write channel structure 120.

Referring to FIGS. 2A and 2D, the read gate electrode layer 150 of the read transistor RTS may be disposed over the write channel structure 120. The read gate electrode layer 150 may be a gate electrode of the read transistor RTS. A surface area of the read gate electrode layer 150 on an x-y plane may be substantially the same as the cross-sectional area of the write channel structure 120 on the same x-y plane. As an example, the read gate electrode layer 150 may have a width w1 in the x-direction and a length d1 in the y-direction. The read gate electrode layer 150 may be electrically connected to the write channel structure 120.

The read gate electrode layer 150 may include a conductive material. The conductive material may include, for example, doped semiconductor, metal, conductive metal nitride, conductive metal carbide, conductive metal silicide, conductive metal oxide, or a combination of two or more thereof. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIGS. 2A, 2D, and 2E, the second contact layer 114 may be disposed between the write channel structure 120 and the read gate electrode layer 150. The second contact layer 114 may serve to reduce the contact resistance at an interface of the write channel structure 120 and the read gate electrode layer 150. A surface area of the second contact layer 114 on an x-y plane may be substantially the same as the cross-sectional area of the write channel structure 120 on the same x-y plane. As an example, the second contact layer 114 may have a width w1 in the x-direction and a length d1 in the y-direction. The read gate electrode layer 150 may be electrically connected to the write channel structure 120 through the second contact layer 114.

The second contact layer 114 may include a conductive material. As an example, the second contact layer 114 may include metal silicide. As another example, the second contact layer 114 may include doped conductive metal oxide, doped transition metal chalcogenide, or a combination of two or more thereof. The second contact layer 114 may include the same material as the write channel structure 120, but may have a higher concentration of dopant than the write channel structure 120. Accordingly, the second contact layer 114 may have higher electrical conductivity than the write channel structure 120.

Referring to FIGS. 2A and 2D, the read gate dielectric layer 160 may be disposed on the read gate electrode layer 150. The read gate dielectric layer 160 may be a gate dielectric layer of the read transistor RTS. A surface area of the read gate dielectric layer 160 on an x-y plane may be substantially the same as the surface area of the read gate electrode layer 150 on the same x-y plane. As an example, the read gate dielectric layer 160 may have a width w1 in the x-direction and a length d1 in the y-direction.

The read gate dielectric layer 160 may include a dielectric material. The dielectric material may include, for example, silicon oxide, silicon nitride, silicon oxynitride, aluminum oxide, hafnium oxide, zirconium oxide, or a combination of two or more thereof.

Referring to FIGS. 2A, 2C, and 2D, the read channel layer 170 may be disposed on the read gate dielectric layer 160. A surface area of the read channel layer 170 on an x-y plane may be substantially the same as the surface area of the read gate dielectric layer 160 on the same x-y plane. As an example, the read channel layer 170 may have a width w1 in the x-direction and a length d1 in the y-direction.

The read channel layer 170 may have an electrically semiconductive property. The read channel layer 170 may include, for example, a semiconductor, conductive metal oxide, transition metal chalcogenide, or a combination of two or more thereof. As an example, the semiconductor may include doped silicon (Si). As another example, the conductive metal oxide may include indium oxide ($In_2O_3$), dopant-doped indium oxide ($In_2O_3$), indium gallium zinc oxide ($InGaZnO_4$), zinc oxide (ZnO), indium gallium oxide ($InGaO_3$), or the like. The dopant may include titanium (Ti), tungsten (W), silicon (Si), or a combination of two or more thereof.

The read word line 180 and the read bit line 190 may be respectively disposed at opposite ends of the read channel layer 170.

The read word line 180 and the read bit line 190 may each be a conductive pattern layer in the form of a line. The read word line 180 and the read bit line 190 may extend in the y-direction parallel to the surface 101S of the substrate 101. In an embodiment, the read word line 180 and the read bit line 190 may be disposed in substantially the same direction as the write word lines 140a and 140b. The read word line 180, the read channel layer 170, and the read bit line 190 may be disposed on the same plane. As an example, the read word line 180, the read channel layer 170, and the read bit line 190 may be disposed on an x-y plane parallel to the surface 101S of the substrate 101.

Each of the read word line 180 and the read bit line 190 may include a conductive material. The conductive material may include, for example, doped semiconductor, metal, conductive metal nitride, conductive metal carbide, conductive metal silicide, conductive metal oxide, or a combination of two or more thereof. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The third contact layer 116 may be disposed between the read channel layer 170 and the read word line 180. The third contact layer 116 may serve to reduce the contact resistance at a junction between the read channel layer 170 and the read word line 180. The fourth contact layer 118 may be disposed between the read channel layer 170 and the read bit line 190. The fourth contact layer 118 may serve to reduce the contact resistance at a junction between the read channel layer 170 and the read bit line 190. The surface areas of the third and fourth contact layers 116 and 118 may be substantially the same as the surface area of the read channel layer 170 on an y-z plane that is perpendicular to the surface 101S of the substrate 101.

Each of the third and fourth contact layers 116 and 118 may include a conductive material. As an example, each of the third and fourth contact layers 116 and 118 may include metal silicide. As another example, each of the third and fourth contact layers 116 and 118 may include doped conductive metal oxide, doped transition metal chalcogenide, or a combination of two or more thereof. Each of the third and fourth contact layers 116 and 118 may include the same material as the read channel layer 170, but may have a higher concentration of dopant than the read channel layer 170. Accordingly, each of the third and fourth contact layers 116 and 118 may have higher electrical conductivity than the read channel layer 170.

In some embodiments, at least one of the first to fourth contact layers 112, 114, 116, and 118 may be omitted from a junction or interface. In this case, the contact resistance of the one or more junctions from which the contact layer is omitted may meet a target resistance required for the device to operate. In an embodiment, without first contact layer 112, the write channel structure 120 extends in z-direction to contact the write bit line 110. In another embodiment, without second contact layer 112, the write channel structure 120 extends in z-direction to contact the gate electrode layer 150. In still another embodiment, without third contact layer 116, the read channel layer 170 contacts the read word line 180. In still another embodiment, without fourth contact layer 118, the read channel layer 170 contacts the read bit line 190.

In some embodiments, the extension direction of the write bit line 110, the extension direction of the write word lines 140a and 140b, and the extension direction of the read word line 180 and the read bit line 190 may be variously modified according to the design of the semiconductor device. As an example, the extension direction of the write word lines 140a and 140b may be substantially the same as the extension direction of the write bit line 110. As another example, the extension direction of the read word line 180 and the read bit line 190 may be non-parallel to the extension direction of the write word lines 140a and 140b. Alternatively, the extension direction of the read word line 180 and the read bit line 190 may be parallel to the extension direction of the write bit line 110.

Although not illustrated in FIG. 2A, the semiconductor device 2 may include an integrated circuit disposed between the substrate 101 and the memory cell MCS. That is, the integrated circuit may be disposed in a space between an upper portion of the substrate 101 and a lower portion of the memory cell MCS. As a specific example, the integrated circuit may be disposed between the substrate 101 and the write bit line 110. In this example, the base insulation layer 105 may be disposed to cover the integrated circuit.

The integrated circuit may include a peripheral circuit for driving and controlling the memory cell MCS. The integrated circuit may include devices such as diodes and transistors. Accordingly, the semiconductor device 2 may have a structure in which the peripheral circuit is disposed below the memory cell MCS.

As described above, according to an embodiment of the present disclosure, the semiconductor device 2 may include a memory cell MCS including a write transistor WTS and a read transistor RTS electrically connected to each other. The memory cell MCS may perform a memory operation according to the circuit configuration of the memory cell MC of FIG. 1.

In an embodiment, the write transistor WTS and the read transistor RTS may be three-dimensionally disposed along the z-direction over the substrate 101. As an example, the first contact layer 112, the write channel structure 120, the second contact layer 114, the read gate electrode layer 150, the read gate dielectric layer 160, and the read channel layer 170 may be stacked to overlap with each other over the write bit line 110. In addition, the write bit line 110, the write word lines 140a and 140b, and the read word line 180 (or read bit line 190) may be disposed on different planes in the z-direction. A semiconductor device in which the density of the memory cells MCS is increased results from the three-dimensional arrangement of the write transistor WTS and the read transistor RTS described above.

Figure 3A:
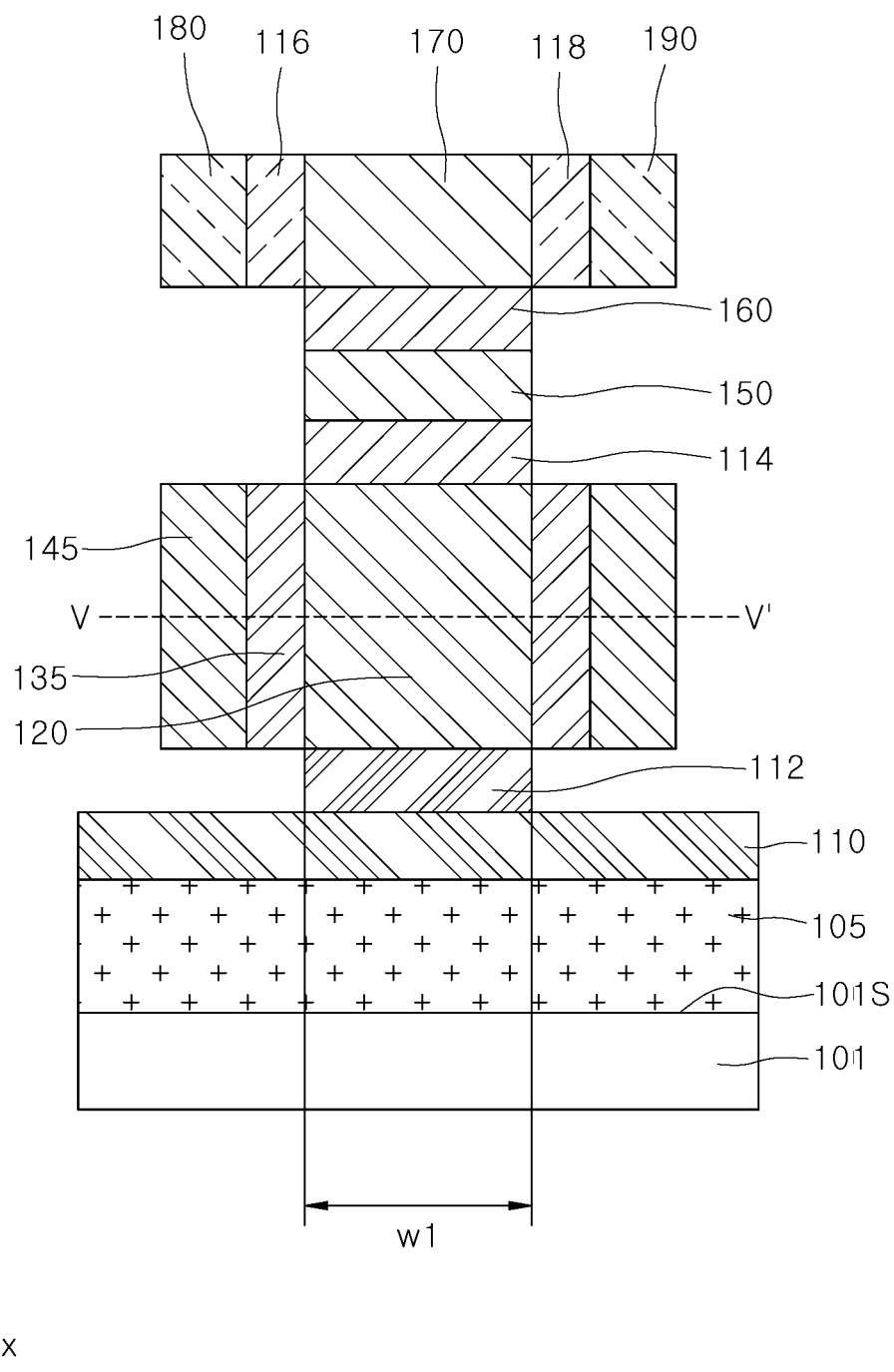
FIG. 3A is a cross-sectional view schematically illustrating a semiconductor device according to an embodiment of the present disclosure.
Figure 3B:
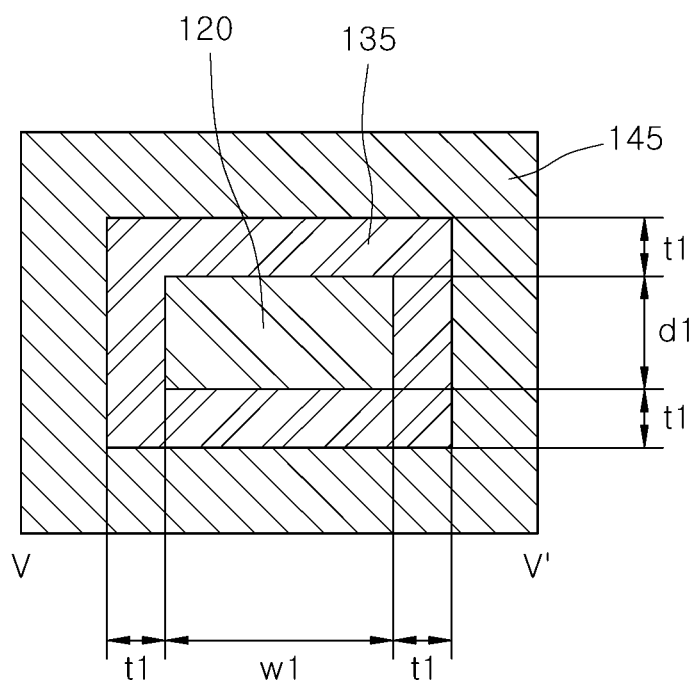
FIG. 3B is a cross-sectional view taken along a line V-V' of a semiconductor device of FIG. 3A on the x-y plane.

FIG. 3A is a cross-sectional view schematically illustrating a semiconductor device according to an embodiment of the present disclosure. FIG. 3B is a cross-sectional view taken along a line V-V' of a semiconductor device 3 of FIG. 3A on the x-y plane. A semiconductor device 3 of FIGS. 3A and 3B may be different from a semiconductor device 2 described above with reference to FIGS. 2A to 2E with respect to the configurations of a write gate dielectric layer 135 and a write word line 145. The remaining elements in the semiconductor device 3, except for the write gate dielectric layer 135 and the write word line 145, may be substantially the same as same-numbered elements of the semiconductor device 2 described above.

Referring to FIGS. 3A and 3B together, the write gate dielectric layer 135 may be disposed to surround the outer surface of a write channel structure 120. The write gate dielectric layer 135 may be disposed to have a predetermined thickness t1 on an outer side surface of the write channel structure 120. The write word line 145 may be disposed on an outer side surface of the write gate dielectric layer 135. The write word line 145 may be disposed to surround the outer surface of the write dielectric layer 135. Accordingly, as illustrated in FIG. 3B, the write word line 145 may be disposed to surround the write channel structure 120 while being spaced apart from the write channel structure 120.

Although not illustrated in FIGS. 3A and 3B, the write word line 145 may extend in a direction parallel to a surface 101S of a substrate 101. As an example, the write word line 145 may be disposed to extend in the x-direction or the y-direction.

Figure 4:
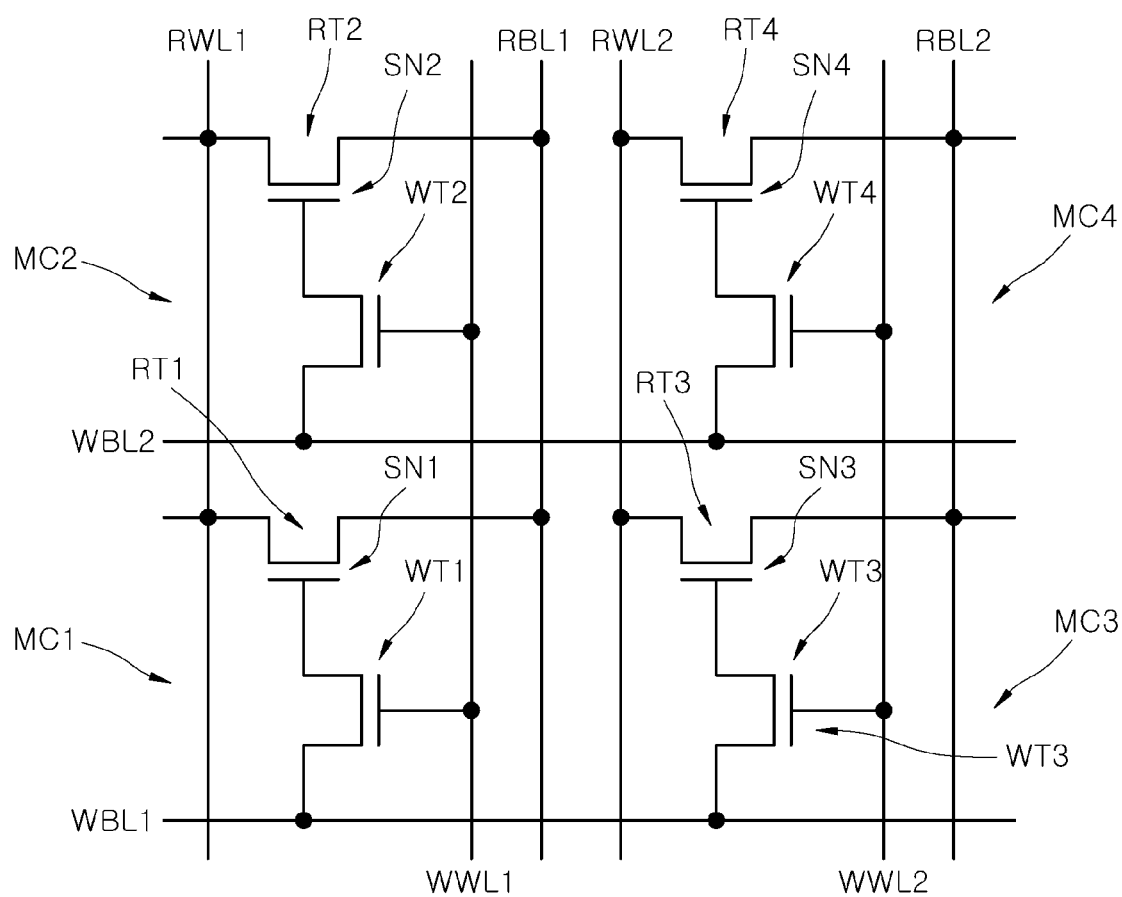
FIG. 4 is a circuit diagram schematically illustrating a plurality of memory cells of a semiconductor device according to an embodiment of the present disclosure.
Figure 5:
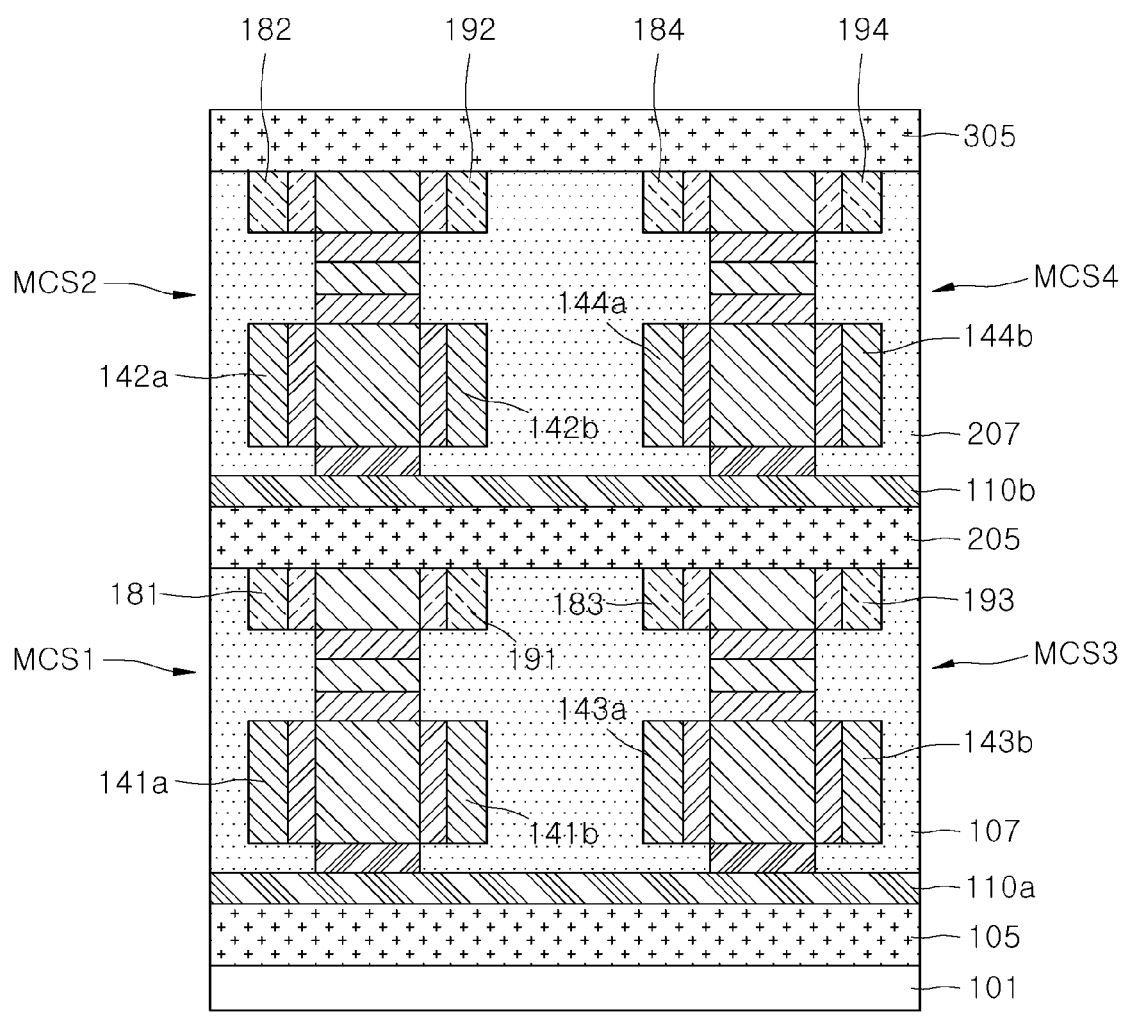
FIG. 5 is a cross-sectional view schematically illustrating a plurality of memory cells of a semiconductor device according to an embodiment of the present disclosure.

FIG. 4 is a circuit diagram schematically illustrating a plurality of memory cells of a semiconductor device according to an embodiment of the present disclosure. FIG. 5 is a cross-sectional view schematically illustrating a plurality of memory cells of a semiconductor device according to an embodiment of the present disclosure.

Referring to FIG. 4, a semiconductor device 4 may include first to fourth memory cells MC1, MC2, MC3, and MC4. The first memory cell MC1 may include a first write transistor WT1 and a first read transistor RT1. Similarly, the second, third, and fourth memory cells MC2, MC3, and MC4 may include corresponding second, third, and fourth write transistors WT2, WT3, and WT4 and second, third, and fourth read transistors RT2, RT3, and RT4, respectively. The configuration of each of the first to fourth write transistors WT1, WT2, WT3, and WT4 may be substantially the same as the configuration of the write transistor WT of the memory cell MC described above with reference to FIG. 1. The configuration of each of the first to fourth read transistors RT1, RT2, RT3, and RT4 may be substantially the same as the configuration of the read transistor RT of the memory cell MC described above with reference to FIG. 1.

Referring to FIG. 4, the first memory cell MC1 and the third memory cell MC3 may share a first write bit line WBL1. The first memory cell MC1 and the second memory cell MC2 may share a first write word line WWL1, a first read word line RWL1, and a first read bit line RBL1. The second memory cell MC2 and the fourth memory cell MC4 may share a second write bit line WBL2. The third memory cell MC3 and the fourth memory cell MC4 may share a second write word line WWL2, a second read word line RWL2, and a second read bit line RBL2.

Although, FIG. 4 illustrates four memory cells MC1, MC2, MC3, and MC4 with two write bit lines WBL1, WBL2, two read word lines RWL1, RWL2, and two read bit lines RBL1, RBL2, the present disclosure is not necessarily limited thereto. The number of memory cells and corresponding bit and word lines may vary. For example, nine or more memory cells may be disposed in a matrix-like fashion together with three or more corresponding write bit lines, read word lines, and read bit lines.

FIG. 5 is a cross-sectional view of a semiconductor device 5 with elements corresponding to the circuit diagram of FIG. 4. The semiconductor 5 may include first to fourth memory cells MCS1, MCS2, MCS3, and MCS4. The configuration of each of the first to fourth memory cells MCS1, MCS2, MCS3, and MCS4 may each be substantially the same as the configuration of the memory cell MCS described above with reference to FIGS. 2A to 2E.

Referring to FIG. 5, a base insulation layer 105 may be disposed on a substrate 101. A first write bit line 110a extending in the x-direction may be disposed on the base insulation layer 105. The first write bit line 110a may be substantially the same as the write bit line 110 of the memory cell MCS described above with reference to FIGS. 2A to 2E.

The first and third memory cells MCS1 and MCS3 may be disposed on the first write bit line 110a. The first and third memory cells MCS1 and MCS3 may be disposed to be spaced apart from each other in the x-direction. The first and third memory cells MCS1 and MCS3 may share the first write bit line 110a. First write word lines 141a and 141b of the first memory cell MCS1 and third write word lines 143a and 143b of the third memory cell MCS3 may extend in the y-direction. A read word line 181 and a read bit line 191 of the first memory cell MCS1 and a read word line 183 and a read bit line 193 of the third memory cell MCS3 may extend in the y-direction. A first interlayer insulation layer 205 may be disposed over the first and third memory cells MCS1 and MCS3. A first device isolation layer 107 may be disposed between the base insulation layer 105 and the first interlayer insulation layer 205.

A second write bit line 110b extending in the x-direction may be disposed on the first interlayer insulation layer 205. The second write bit line 110b may be substantially the same as the write bit line 110 of the memory cell MCS described above with reference to FIGS. 2A to 2E.

The second and fourth memory cells MCS2 and MCS4 may be disposed over the second write bit line 110b. The second and fourth memory cells MCS2 and MCS4 may be disposed to be spaced apart from each other in the x-direction. The second and fourth memory cells MCS2 and MCS4 may share the second write bit line 110b. Second write word lines 142a and 142b of the second memory cell MCS2 and fourth write word lines 144a and 144b of the fourth memory cell MCS4 may extend in the y-direction. Although not illustrated, in order to correspond to the circuit diagram of FIG. 4, the second write word lines 142a and 142b of the second memory cell MCS2 may be electrically connected to the first write word lines 141a and 141b of the first memory cell MCS1, respectively. In addition, the fourth write word lines 144a and 144b of the fourth memory cell MCS4 may be electrically connected to the third write word lines 143a and 143b of the third memory cell MCS3, respectively.

In addition, a read word line 182 and a read bit line 192 of the second memory cell MCS2 and a read word line 184 and a read bit line 194 of the fourth memory cell MCS4 may extend in the y-direction. Although not illustrated, in order to correspond to the circuit diagram of FIG. 4, the read word line 182 and the read bit line 192 of the second memory cell MCS2 may be electrically connected to the read word line 181 and the read bit line 191 of the first memory cell MCS1, respectively. Further, the read word line 184 and the read bit line 194 of the fourth memory cell MCS4 may be electrically connected to the read word line 183 and the read bit line 193 of the third memory cell MCS3, respectively.

A second interlayer insulation layer 305 may be disposed over the second and fourth memory cells MCS2 and MCS4. A second device isolation layer 207 may be disposed between the first and second interlayer insulation layers 205 and 305.

As described above, according to an embodiment of the present disclosure, a semiconductor may include a plurality of memory cells. Each of the plurality of memory cells may include a write transistor and a read transistor. The plurality of memory cells may share at least some portions of a plurality of write bit lines, a plurality of write word lines, a plurality of read word lines, and a plurality of read bit lines.

Figure 6:
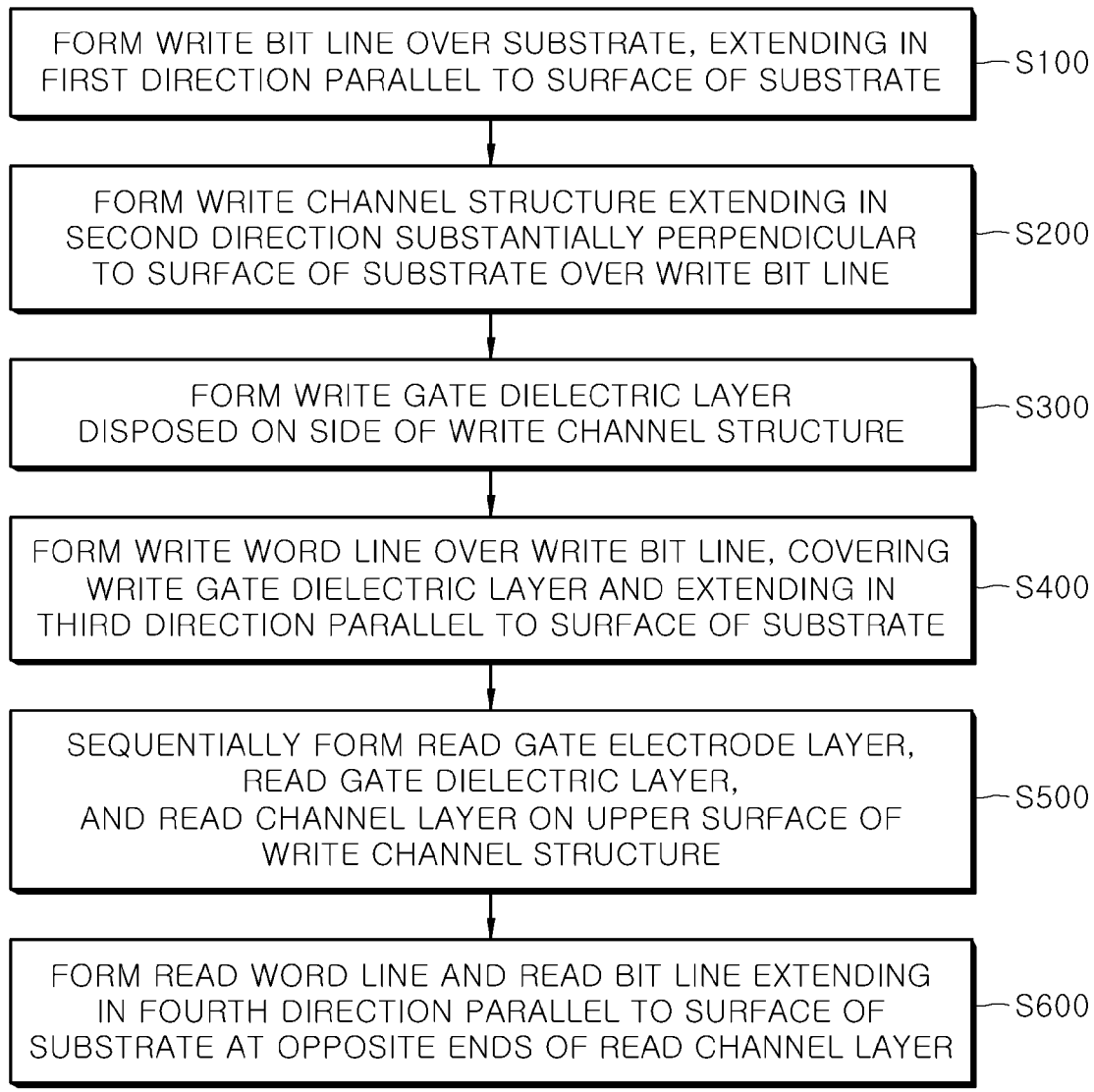
FIG. 6 is a flowchart schematically illustrating a method of manufacturing a semiconductor device according to an embodiment of the present disclosure.

FIG. 6 is a flowchart schematically illustrating a method of manufacturing a semiconductor device according to an embodiment of the present disclosure.

Referring to S100 of FIG. 6, a write bit line extending in a first direction parallel to a surface of a substrate may be formed over a substrate.

Referring to S200 of FIG. 6, a write channel structure extending in a second direction substantially perpendicular to the surface of the substrate may be formed over the write bit line. In an embodiment, the process of forming the write channel structure may include a process of forming a pillar structure electrically connected to the write bit line.

Referring to S300 of FIG. 6, a write gate dielectric layer may be formed on a side surface of the write channel structure. In an embodiment, the process of forming the write gate dielectric layer may include a process of forming a dielectric layer over the substrate that is in contact with a portion of an outer surface of the write channel structure.

Referring to S400 of FIG. 6, a write word line may be formed over the write bit line to cover on the write gate dielectric layer and to extend in a third direction parallel to the surface of the substrate and substantially perpendicular to the first direction.

Referring to S500 of FIG. 6, a read gate electrode layer, a read gate dielectric layer, and a read channel layer may be sequentially formed on an upper surface of the write channel structure. In an embodiment, the process of forming the read gate electrode layer may include a process of forming the read gate electrode layer to have substantially the same cross-sectional surface area as a cross-sectional area of the write channel structure that extends perpendicular to the second direction.

Referring to S600 of FIG. 6, a read word line and a read bit line extending in a fourth direction parallel to the surface of the substrate may be respectively formed at opposite ends of the read channel layer. In this step, the fourth direction may be parallel to the first direction or the third direction.

In some embodiments, a first contact layer may be formed between the write bit line and the write channel structure. A second contact layer may be formed between the write channel structure and the read gate electrode layer. A third contact layer may be formed between the read word line and the read channel layer. A fourth contact layer may be formed between the read bit line and the read channel layer. Through the above-described manufacturing method, semiconductor devices according to embodiments of the present disclosure may be manufactured.

FIGS. 7A to 21A are cross-sectional views schematically illustrating a method of manufacturing a semiconductor device according to an embodiment of the present disclosure. FIGS. 7B to 21B are plan views schematically illustrating a method of manufacturing a semiconductor device according to an embodiment of the present disclosure. FIGS. 7C to 15C are cross-sectional views schematically illustrating structures of FIGS. 7A to 15A taken along a line A-A' on an x-y plane. FIG. 8D is a cross-sectional view illustrating a structure of FIG. 8A taken along a line B-B' on an x-y plane. FIGS. 16C and 17C are cross-sectional views illustrating the structures of FIGS. 16A and 17A taken along a line C-C' on an x-y plane. FIGS. 18C to 21C are cross-sectional views illustrating the structures of FIGS. 18A to 21A taken along a line D-D' on an x-y plane. A method of manufacturing a semiconductor device according to FIGS. 7A to 21A may be applied to the methods of manufacturing a semiconductor device 2 described above with reference to FIGS. 2A to 2E, a semiconductor device 3 described above with reference to FIGS. 3A and 3B, and a semiconductor device 5 described above with reference to FIG. 5.

Figure 7A:
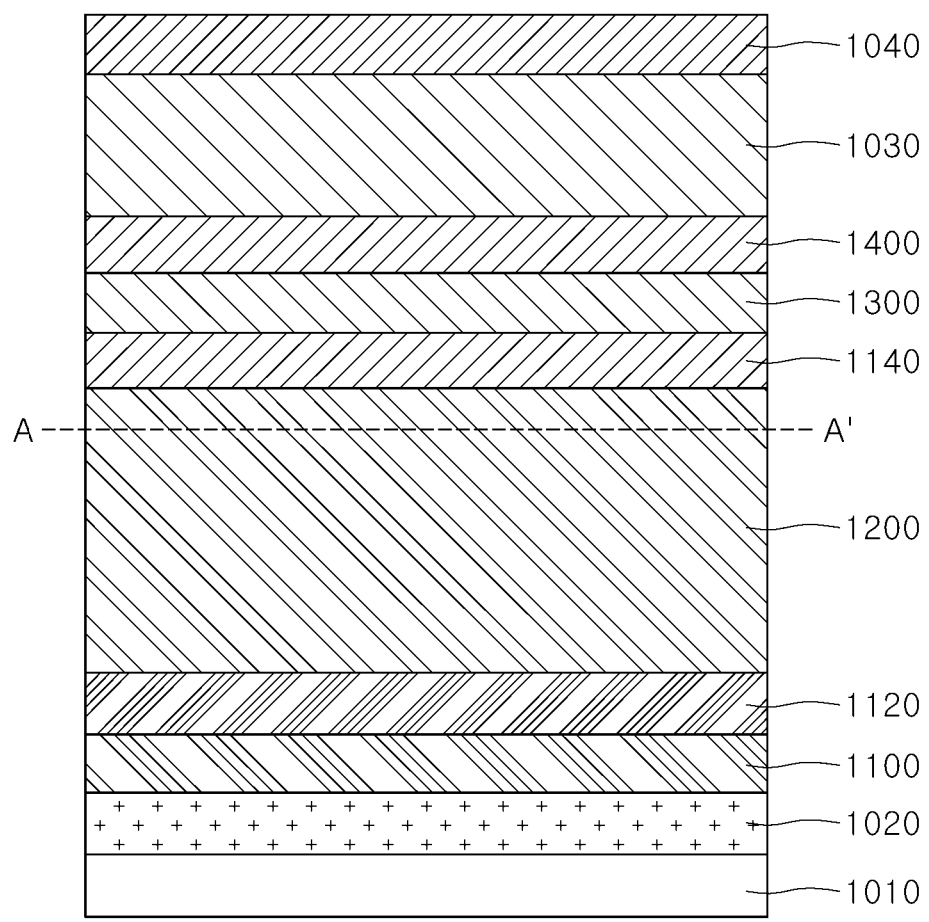
Figure 7B:
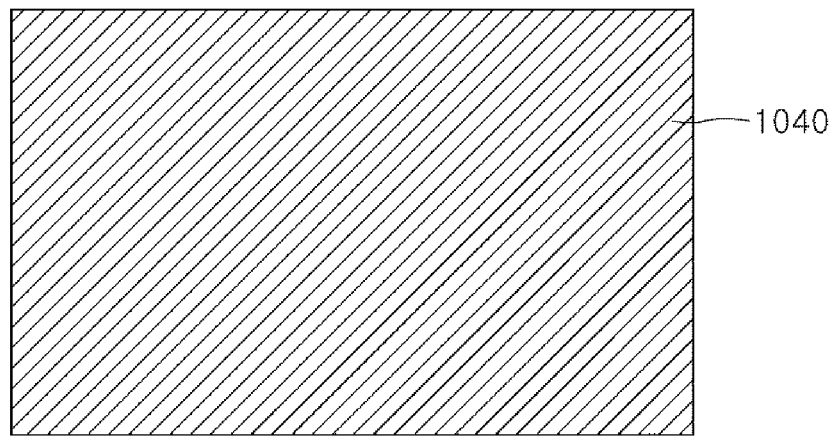
Figure 7C:
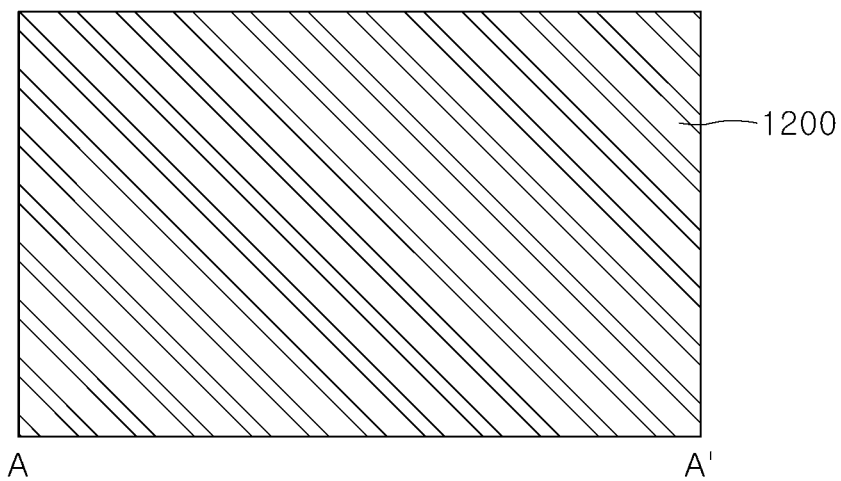
Figure 7C:
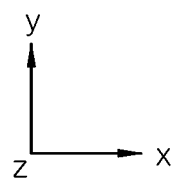

Referring to FIGS. 7A, 7B, and 7C, a substrate 1010 may be provided. The substrate 1010 may include a semiconductor material. Specifically, the semiconductor material may include silicon (Si), germanium (Ge), gallium arsenide (GaAs), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof.

A base insulation layer 1020 may be formed on the substrate 1010. The base insulation layer 1020 may include, for example, oxide, nitride, oxynitride, or a combination of two or more thereof. The base insulation layer 1020 may be formed, for example, using a chemical vapor deposition method, an atomic layer deposition method, a coating method, or the like.

A first conductive layer 1100, a first contact material layer 1120, a first semiconductor layer 1200, a second contact material layer 1140, a second conductive layer 1300, a first dielectric layer 1400, a sacrificial layer 1030, and a protection layer 1040 may be sequentially formed on the base insulation layer 1020.

The first conductive layer 1100 and the second conductive layer 1300 may include a conductive material. The conductive material may include, for example, doped semiconductor, metal, conductive metal nitride, conductive metal carbide, conductive metal silicide, conductive metal oxide, or a combination of two or more thereof. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (AI), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first and second conductive layers 1100 and 1300 may be formed by, for example, a chemical vapor deposition method, an atomic layer deposition method, or a sputtering method.

The first semiconductor layer 1200 may include, for example, a semiconductor, conductive metal oxide, transition metal chalcogenide, or a combination of two or more thereof. As an example, the semiconductor may include doped silicon (Si). As another example, the conductive metal oxide may include indium oxide ($In_2O_3$), dopant-doped indium oxide ($In_2O_3$), indium gallium zinc oxide (InGaZnO$_4$), zinc oxide (ZnO), indium gallium oxide (InGaO$_3$), or the like. The dopant may include titanium (Ti), tungsten (W), silicon (Si), or a combination of two or more thereof. The first semiconductor layer 1200 may be formed, for example, by a chemical vapor deposition method, an atomic layer deposition method, or a sputtering method.

The first and second contact layers 1120 and 1140 may reduce the contact resistance between the first conductive layer 1100 and the first semiconductor layer 1200 and the contact resistance between the second conductive layer 1300 and the first semiconductor layer 1200. Each of the first and second contact layers 1120 and 1140 may include a conductive material. As an example, each of the first and second contact layers 1120 and 1140 may include metal silicide. In another embodiment, each of the first and second contact layers 1120 and 1140 may include doped conductive metal oxide, doped transition metal chalcogenide, or a combination of two or more thereof. The first and second contact layers 1120 and 1140 may include substantially the same material as the first semiconductor layer 1200, but may have a higher concentration of dopant than the first semiconductor layer 1200. Accordingly, each of the first and second contact layers 1120 and 1140 may have higher electrical conductivity than the first semiconductor layer 1200. The first and second contact layers 1120 and 1140 may be formed, for example, by a chemical vapor deposition method, an atomic layer deposition method, or a sputtering method.

The first dielectric layer 1400 may include a dielectric material. The dielectric material may include, for example, silicon oxide, silicon nitride, silicon oxynitride, aluminum oxide, hafnium oxide, zirconium oxide, or a combination of two or more thereof. The first dielectric layer 1400 may be formed, for example, by a chemical vapor deposition method, an atomic layer deposition method, or a sputtering method.

The sacrificial layer 1030 may include a material having an etch selectivity with respect to a predetermined wet etchant, as compared to the first dielectric layer 1400 and the protection layer 1040. The sacrificial layer 1030 may include, for example, silicon (Si), silicon oxide, silicon nitride, silicon oxynitride, or the like. The sacrificial layer 1030 may be formed, for example, by a chemical vapor deposition method, an atomic layer deposition method, or a coating method.

The protection layer 1040 may include an insulating material. The insulating material may include, for example, silicon oxide, silicon nitride, silicon oxynitride, or the like. The protection layer 1040 may be formed, for example, by a chemical vapor deposition method, an atomic layer deposition method, or a coating method.

Although not illustrated in FIGS. 7A, 7B, and 7C, an integrated circuit may be formed between the substrate 1010 and the first conductive layer 1100. In this case, the base insulation layer 1020 may be formed over the substrate 1010 to cover the integrated circuit. The integrated circuit may include a peripheral circuit driving and controlling the memory cells MCS. The integrated circuit may include devices such as diodes, transistors, and the like.

Figure 8A:
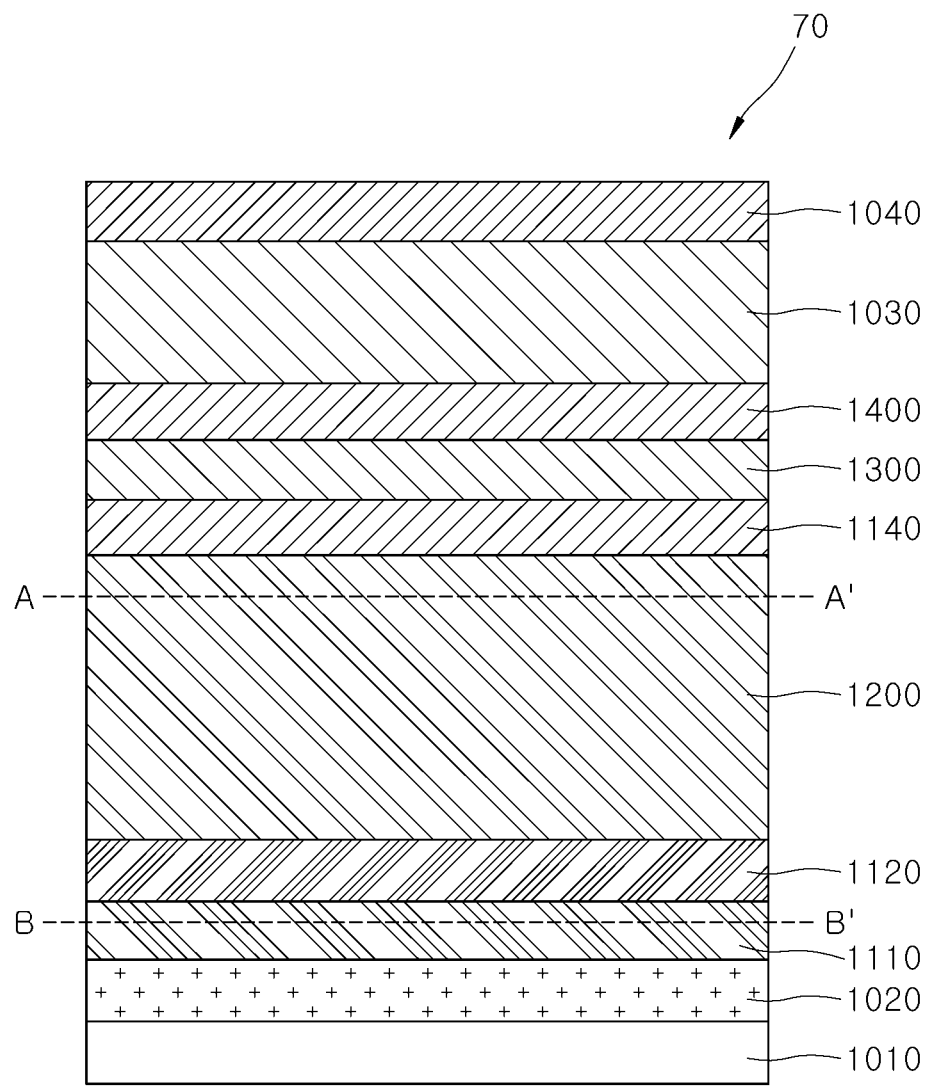
Figure 8B:
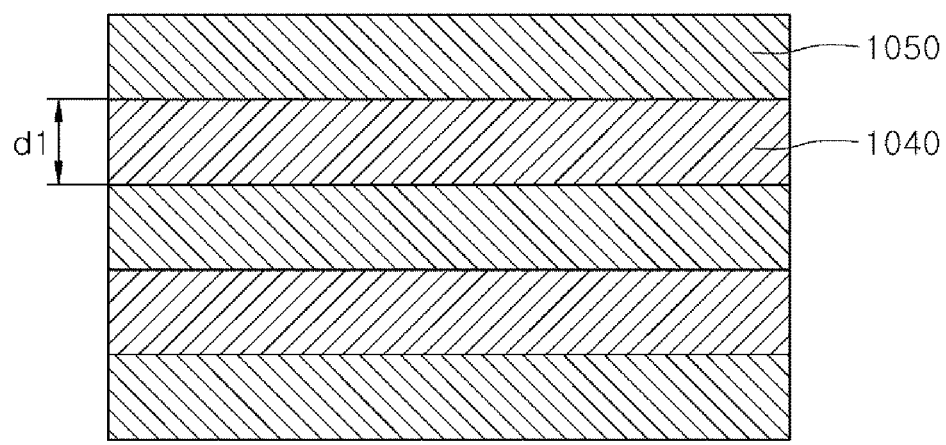
Figure 8C:
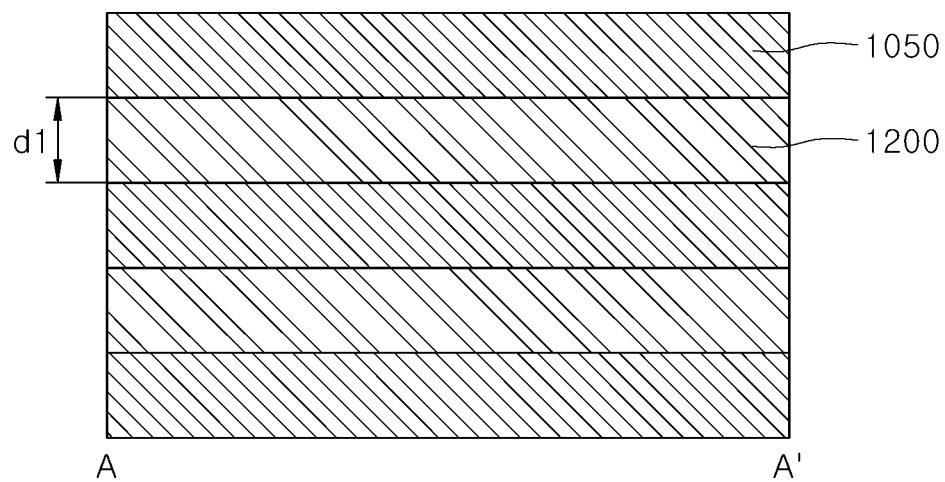
Figure 8D:
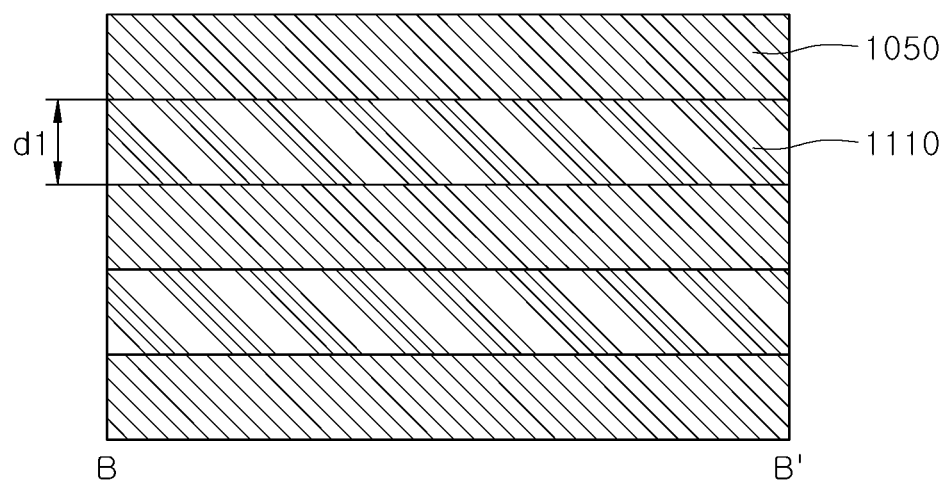
FIG. 8D is a cross-sectional view illustrating a structure of FIG. 8A taken along a line B-B' on an x-y plane.

Referring to FIGS. 8A, 8B, 8C, and 8D, the resultant structure of FIG. 7A may be patterned in the vertical direction to expose the base insulation layer 1020. A first interlayer insulation layer 1050 may be formed in spaces of the base insulation layer 1020 exposed by the patterning process. In the patterning process, the base insulation layer 1020 may be exposed in the shape of line patterns repeated at regular intervals as illustrated in FIG. 8B, and the first interlayer insulation layer 1050 may fill in the exposed spaces. As a result, a first pattern structure 70 may be formed. The first pattern structure 70 may have a predetermined width d1 in the y-direction and may extend in the x-direction. Referring to FIG. 8D, the first conductive layer (1100 of FIG. 7A) may be converted into a write bit line 1110 having a line width d1 in the y-direction by the patterning process. The write bit line 1110 may correspond to a write bit line 110 of a semiconductor device 2 described above with reference to FIGS. 2A to 2E.

The first interlayer insulation layer 1050 may include, for example, silicon oxide, silicon nitride, or silicon oxynitride. The first interlayer insulation layer 1050 may be formed by, for example, a chemical vapor deposition method or a coating method. Referring to FIG. 8B, an upper surface of the first interlayer insulation layer 1050 may be disposed on the same plane as an upper surface of the first pattern structure 70.

Figure 9A:
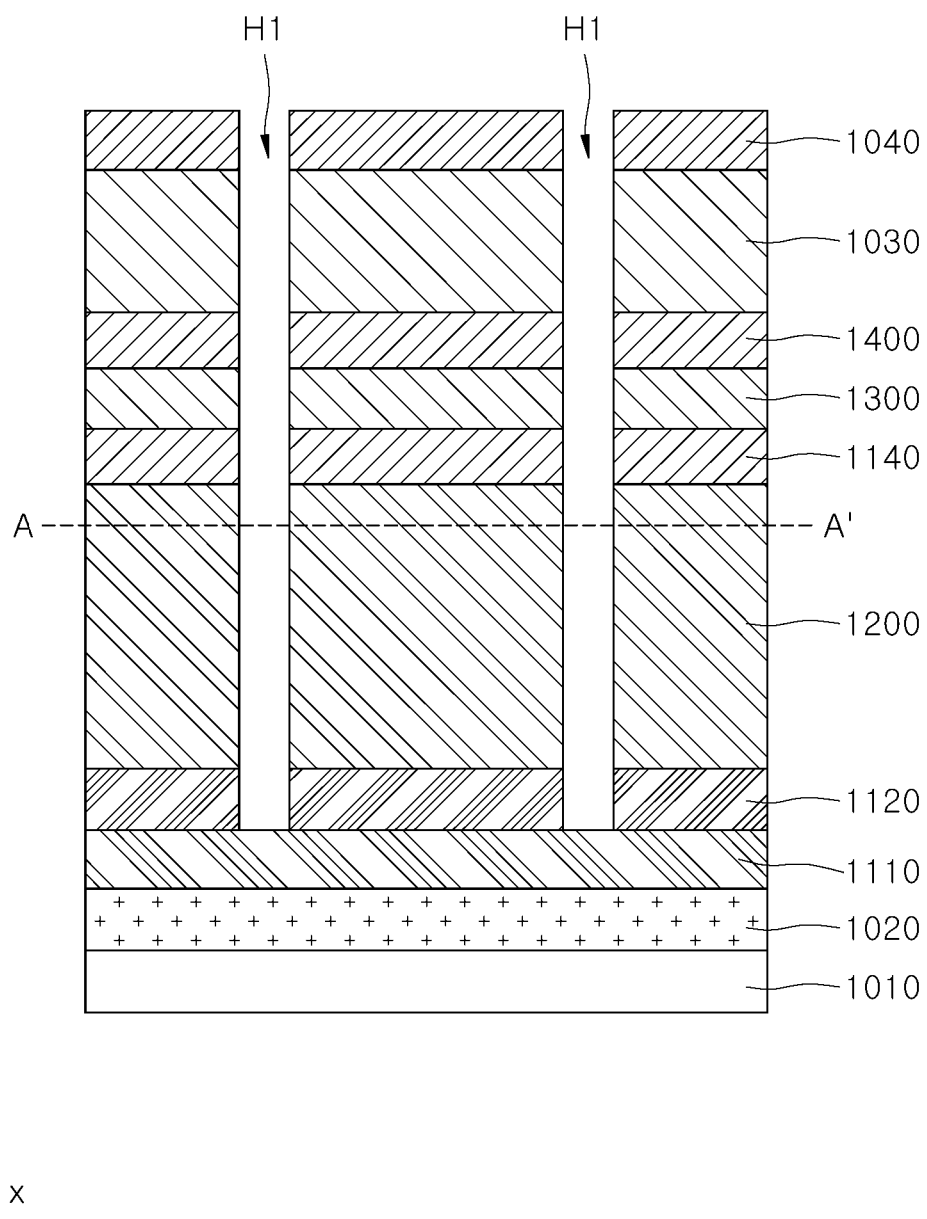
Figure 9B:
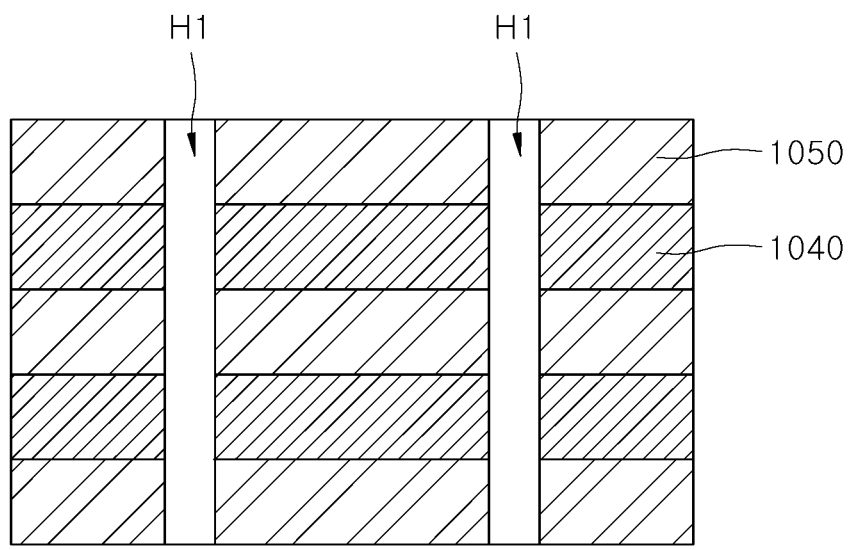
Figure 9C:
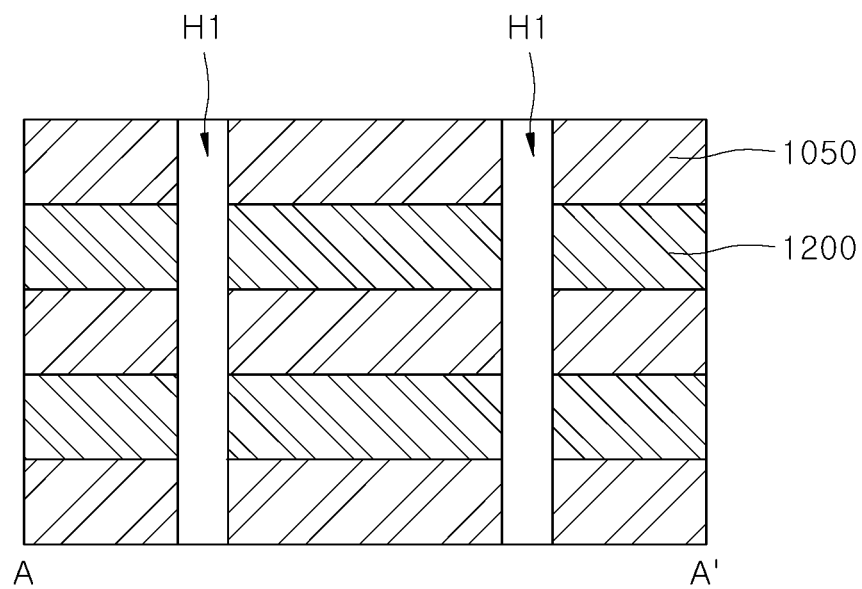

Referring to FIGS. 9A, 9B, and 9C, the first pattern structure 70 may be patterned in the vertical direction to form first trench patterns H1, which extend in the y-direction. The patterning process may be performed by sequentially performing anisotropic etching to the protection layer 1040, the sacrificial layer 1030, the first dielectric layer 1400, the second conductive layer 1300, the second contact material layer 1140, the first semiconductor layer 1200, and the first contact material layer 1120. In addition, the patterning process includes performing anisotropic etching to the first interlayer insulation layer 1050 on the base insulation layer 1020. After the patterning process, the first conductive layer 1110 and the base insulation layer 1020 are exposed in the first trench patterns H1 along the y-direction.

Figure 10A:
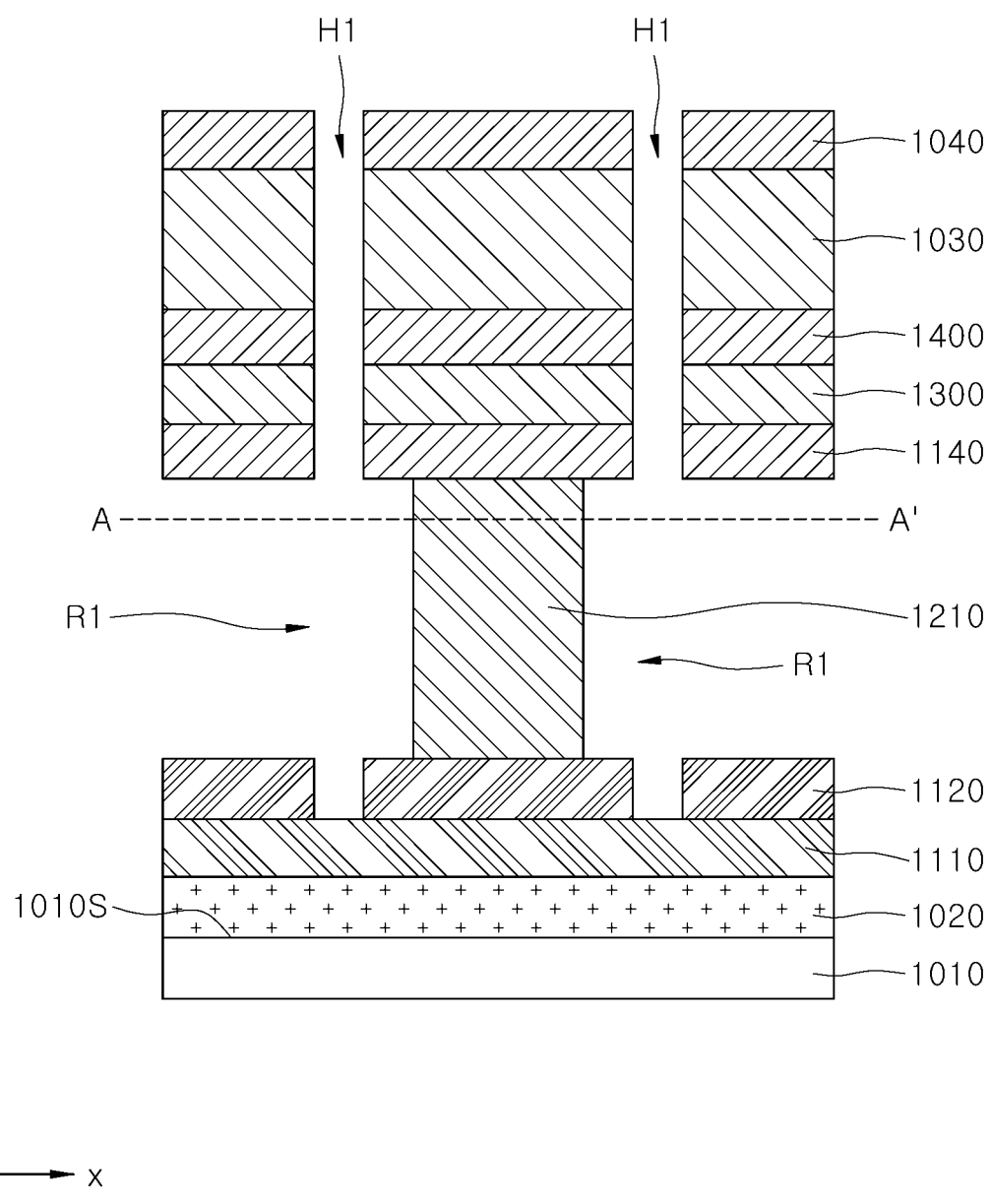
Figure 10B:
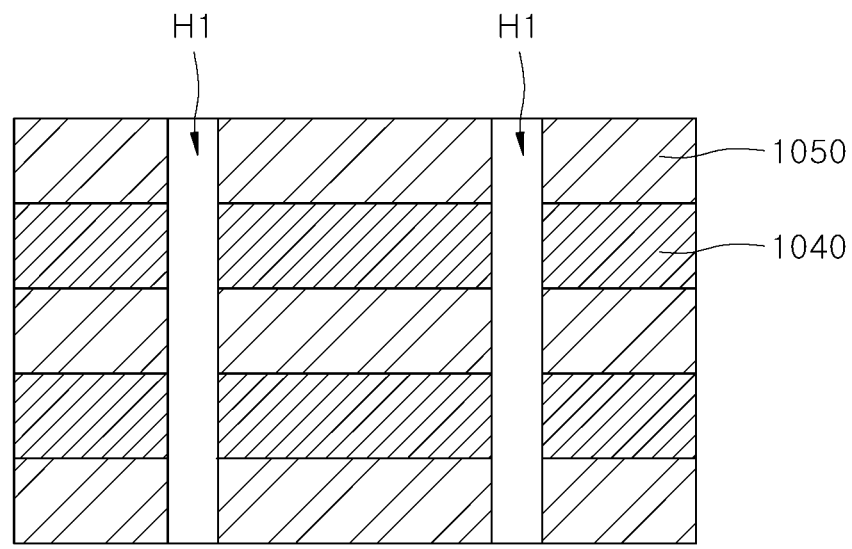
Figure 10B:
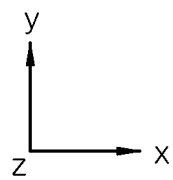
Figure 10C:
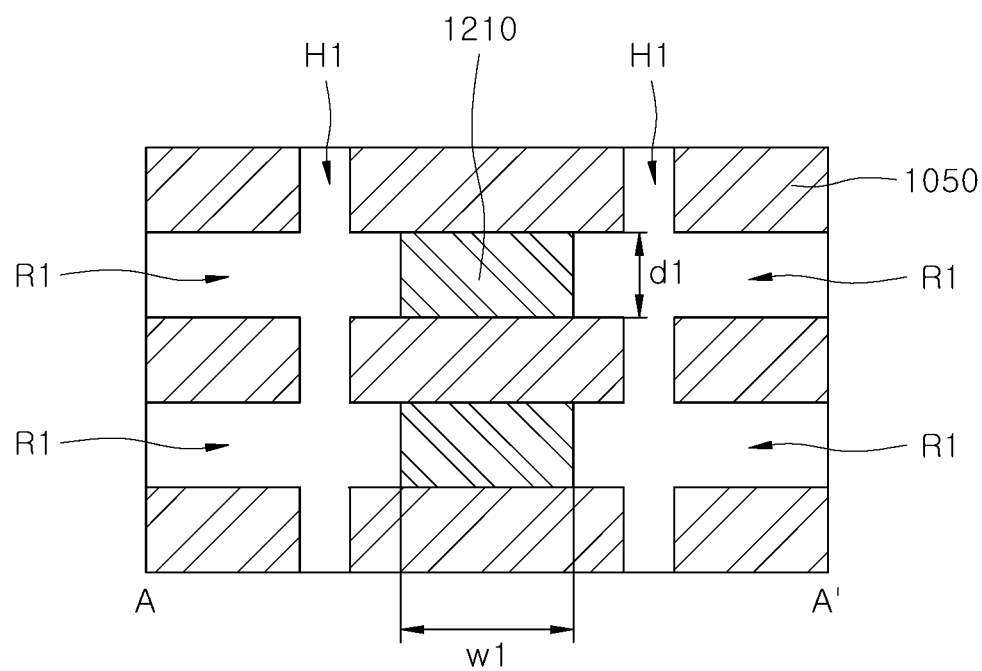

Referring to FIGS. 10A, 10B, and 10C, a wet etchant may be provided through the first trench patterns H1 to partially etch the first semiconductor layer 1200. Referring to FIGS. 10A and 10C, by this partial etching, first recess spaces R1 may be formed, and the first semiconductor layer (1200 of FIG. 9A) may be converted into a quadrangular pillar structure having a quadrangular cross-sectional shape. That is, the first semiconductor layer (1200 of FIG. 9A) may be converted into a write channel structure 1210 having the pillar structure by the etching. The write channel structure 1210 may have a predetermined width w1 along the x-direction and the length d1 along the y-direction. The write channel structure 1210 may extend in the z-direction substantially perpendicular to a surface 1010S of the substrate 1010. The write channel structure 1210 may correspond to a write channel structure 120 of a semiconductor device 2 described above with reference to FIGS. 2A to 2E.

Figure 11A:
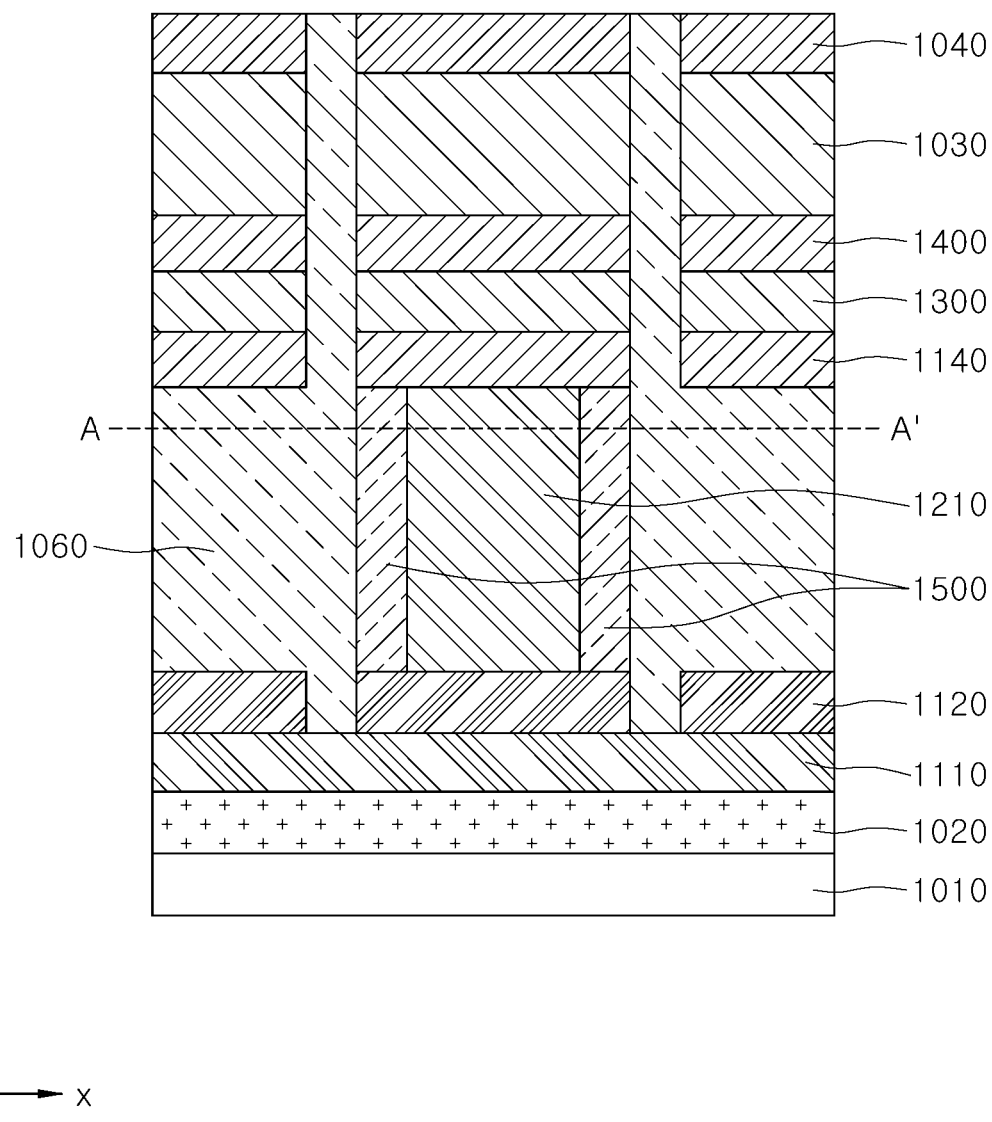
Figure 11B:
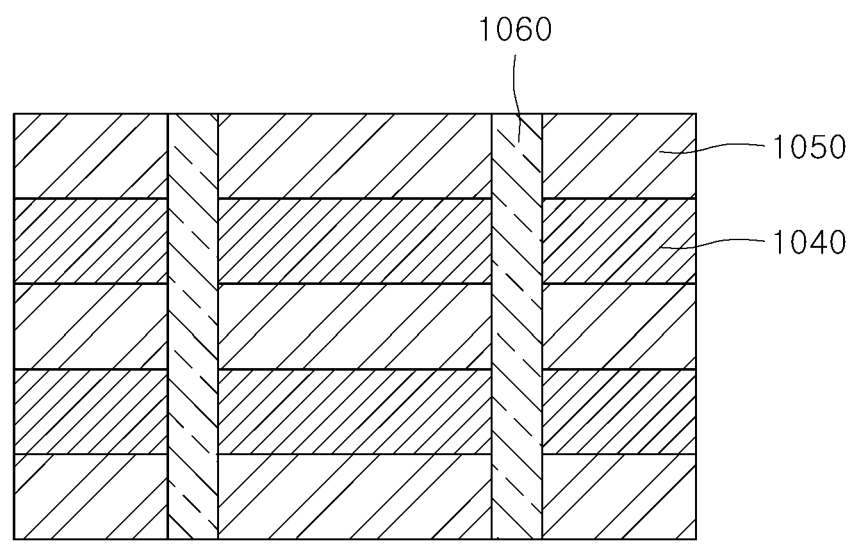
Figure 11C:
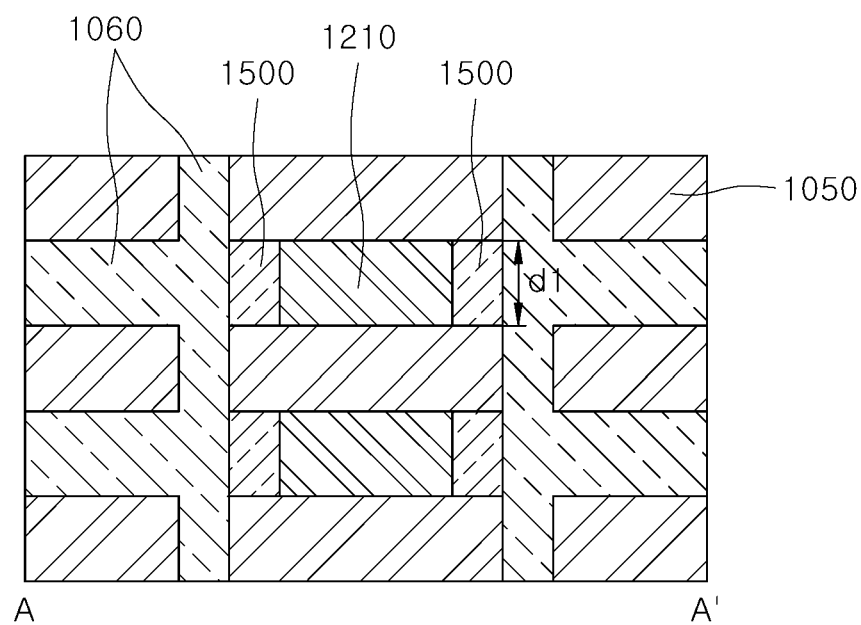

Referring to FIGS. 11A, 11B, and 11C, a second dielectric layer 1500 may be formed on both side surfaces of the write channel structure 1210. As illustrated in FIG. 11C, the second dielectric layer 1500 may have a length in the y-direction corresponding to the length d1 of the write channel structure 1210. The second dielectric layer 1500 may include, for example, silicon oxide, silicon nitride, silicon oxynitride, aluminum oxide, hafnium oxide, zirconium oxide, or combination of two or more thereof. The second dielectric layer 1500 may be formed using, for example, a chemical vapor deposition method, an atomic layer deposition method, or the like. The second dielectric layer 1500 may correspond to write gate dielectric layers 130a and 130b of a semiconductor device 2 described above with reference to FIGS. 2A to 2E.

Next, a second interlayer insulation layer 1060 may be formed to fill the first recess spaces R1 and the first trench patterns H1. The second interlayer insulation layer 1060 may include, for example, silicon oxide, silicon nitride, or silicon oxynitride. The second interlayer insulation layer 1060 may be formed by, for example, a chemical vapor deposition method or a coating method.

Figure 12A:
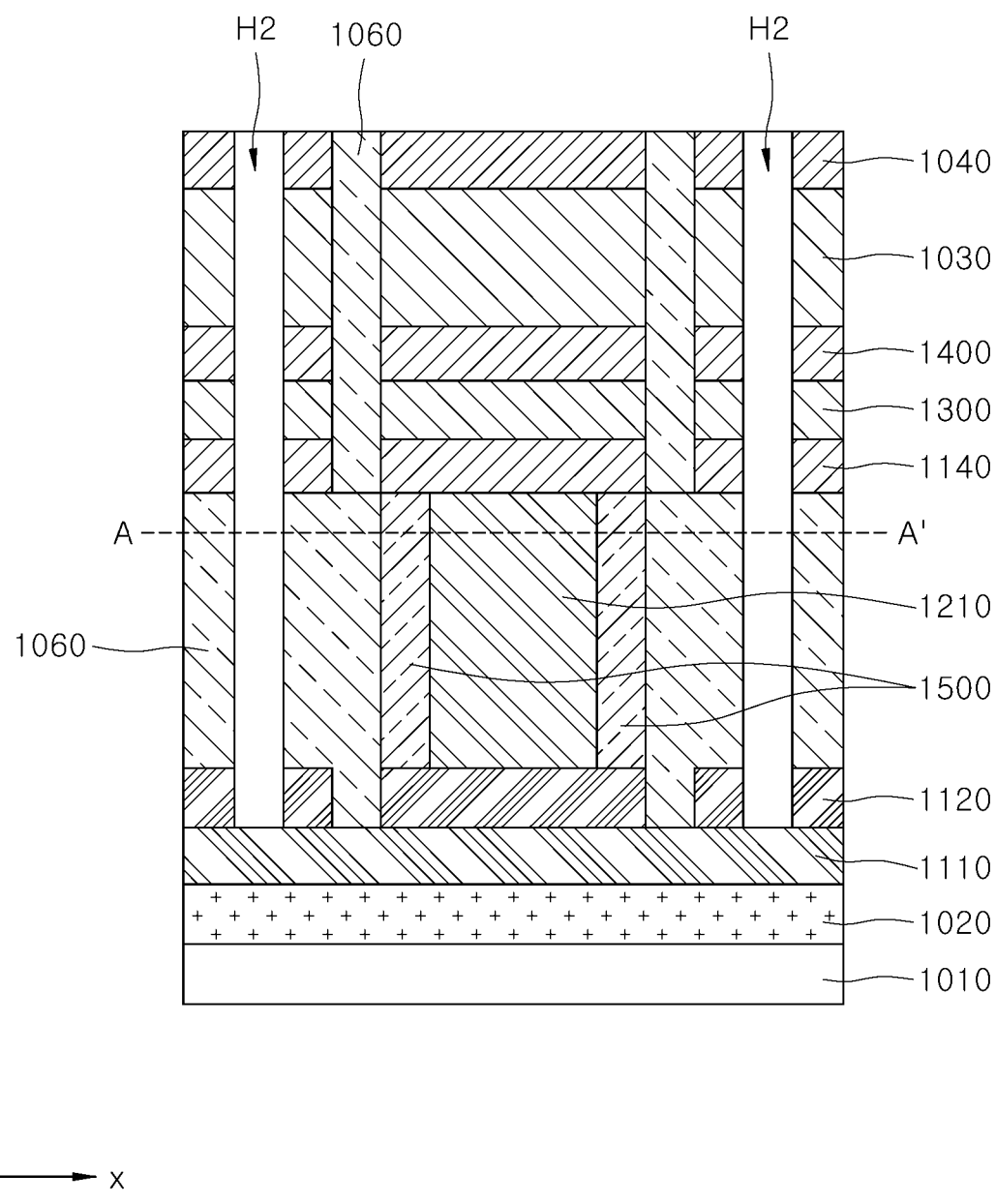
Figure 12B:
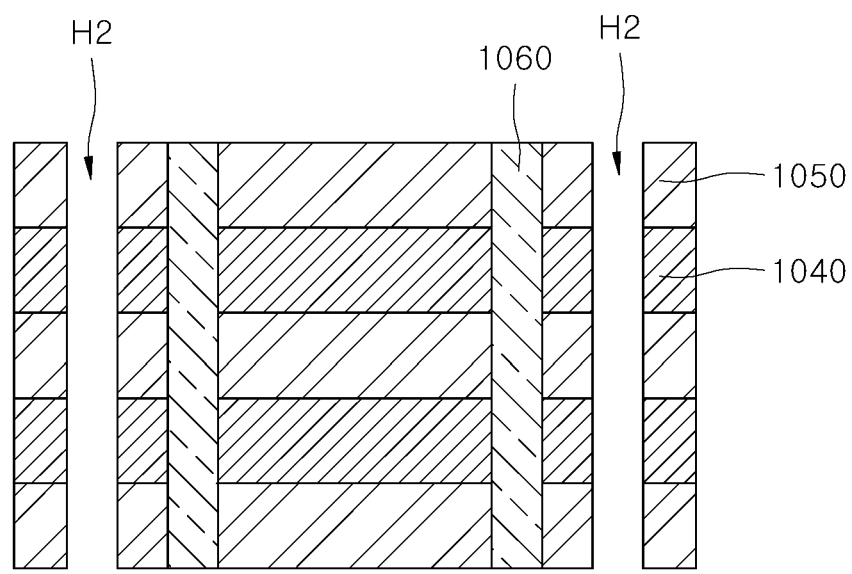
Figure 12C:
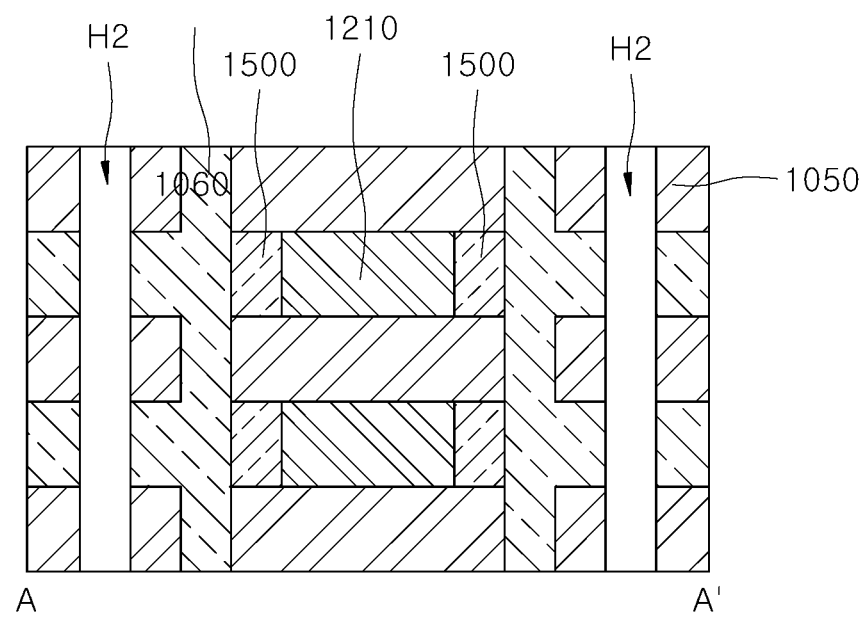
Figure 13A:
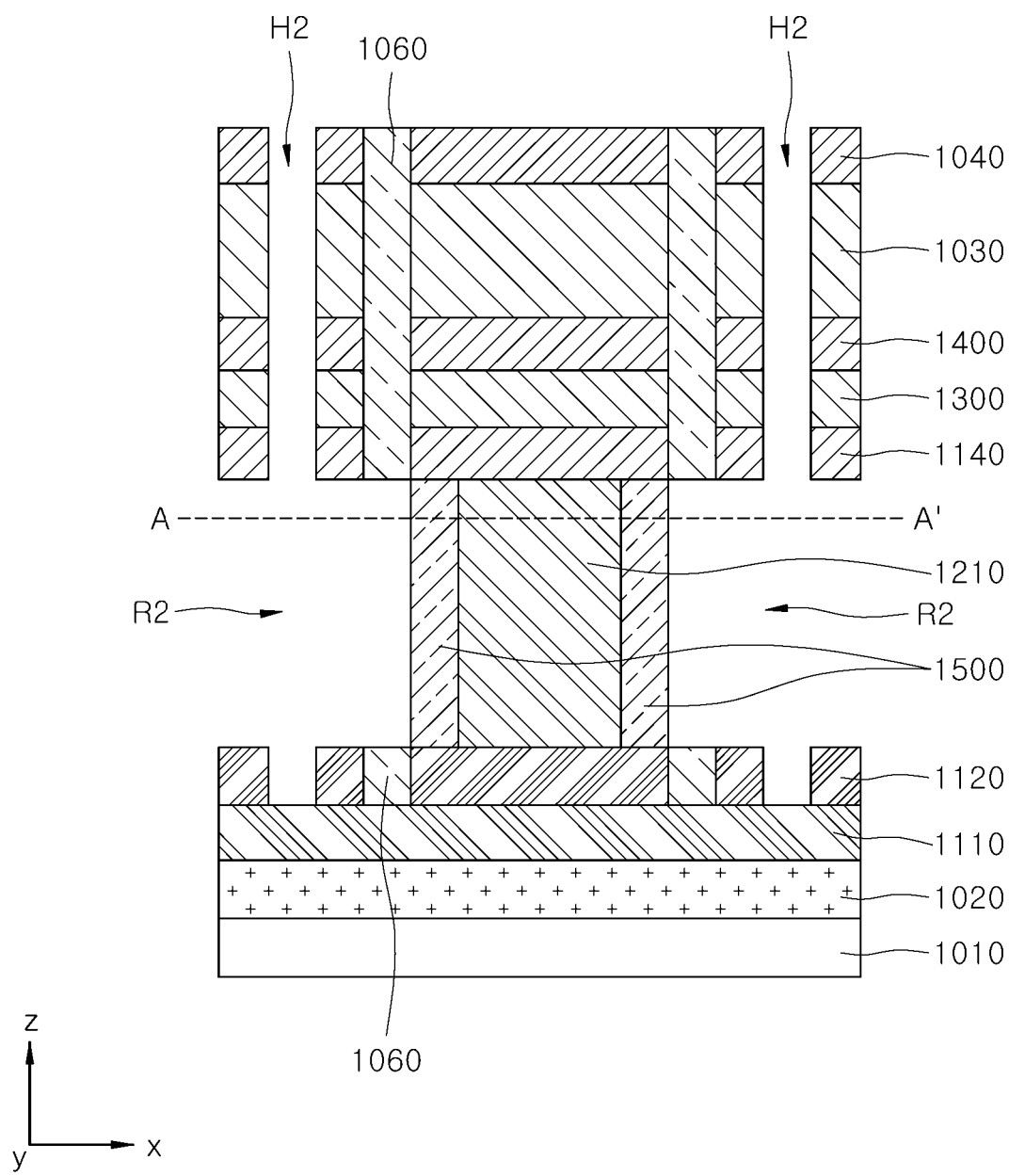
Figure 13B:
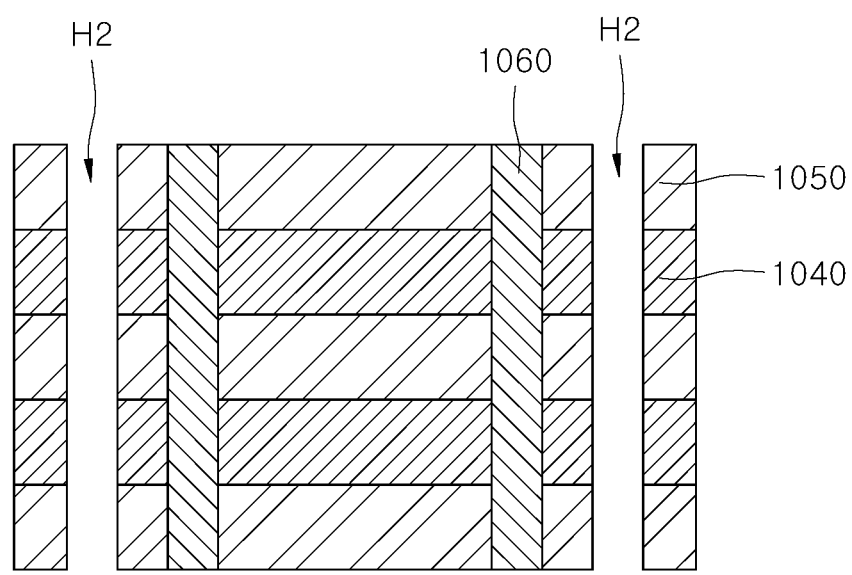
Figure 13C:
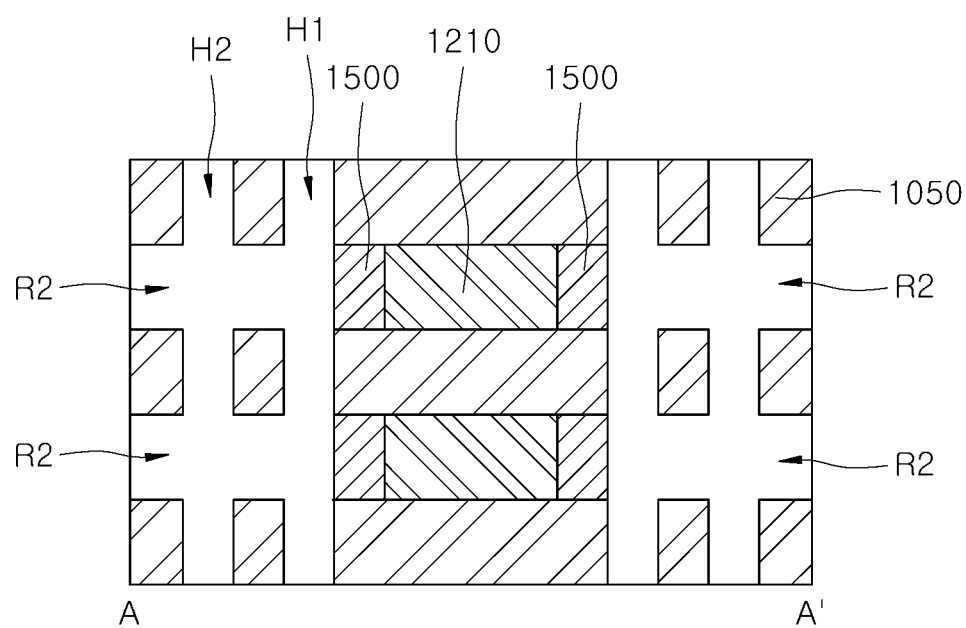

Referring to FIGS. 12A, 12B, and 12C, the resultant structure of FIGS. 11A, 11B, and 11C may be patterned in the vertical direction to form second trench patterns H2 that extend in the y-direction. The patterning process may be performed by sequentially performing anisotropic etching to the protection layer 1040, the sacrificial layer 1030, the first dielectric layer 1400, the second conductive layer 1300, the second contact material layer 1140, the second interlayer insulation layer 1060, and the first contact material layer 1120. In addition, the patterning process includes performing anisotropic etching to the first interlayer insulation layer 1050 on the base insulation layer 1020. After the patterning process, the first conductive layer 1110 and the base insulation layer 1020 are exposed in the first trench patterns H2 along the y-direction Referring to FIGS. 13A, 13B, and 13C, a wet etchant may be provided through the second trench patterns H2 to partially etch the second interlayer insulation layer 1060. Referring to FIGS. 13A and 13C, through the partial etching, second recess spaces R2 may be formed, and the second dielectric layer 1500 may be exposed.

Figure 14B:
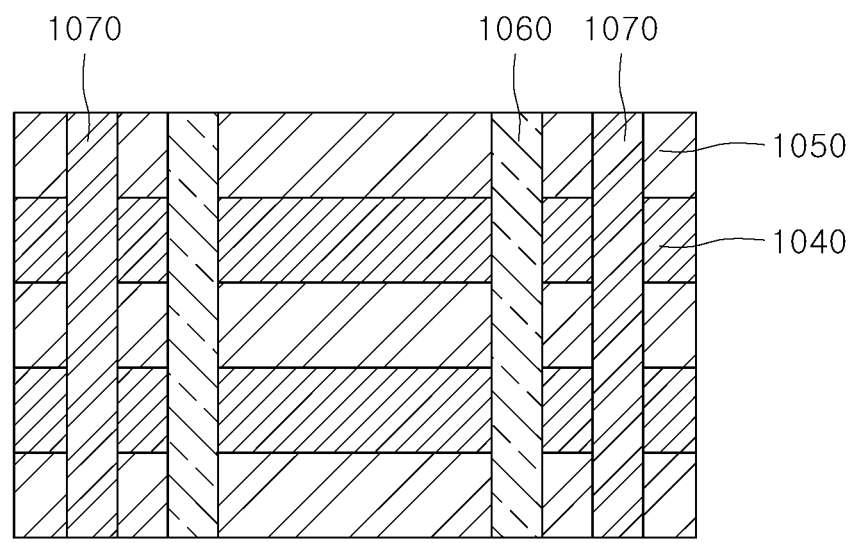
Figure 14C:
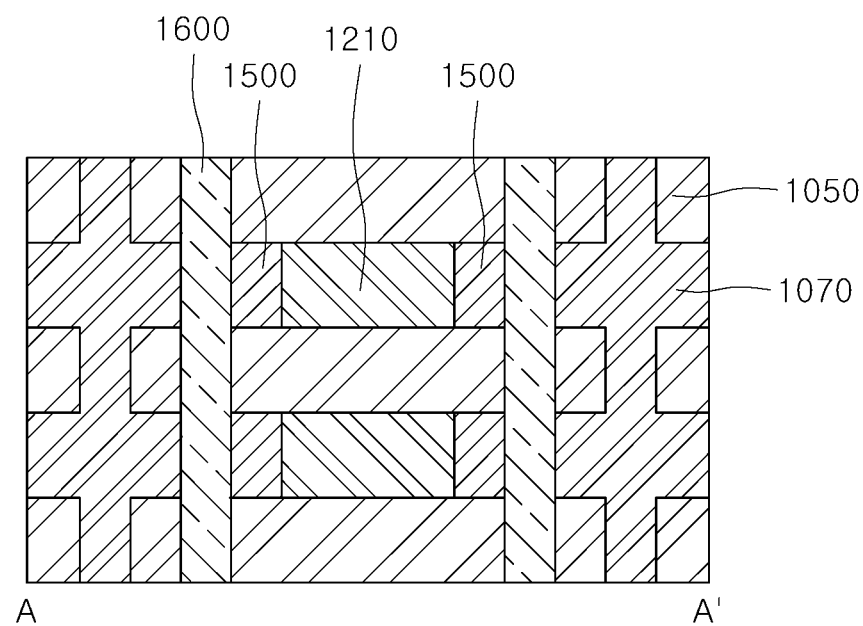
Figure 14A:
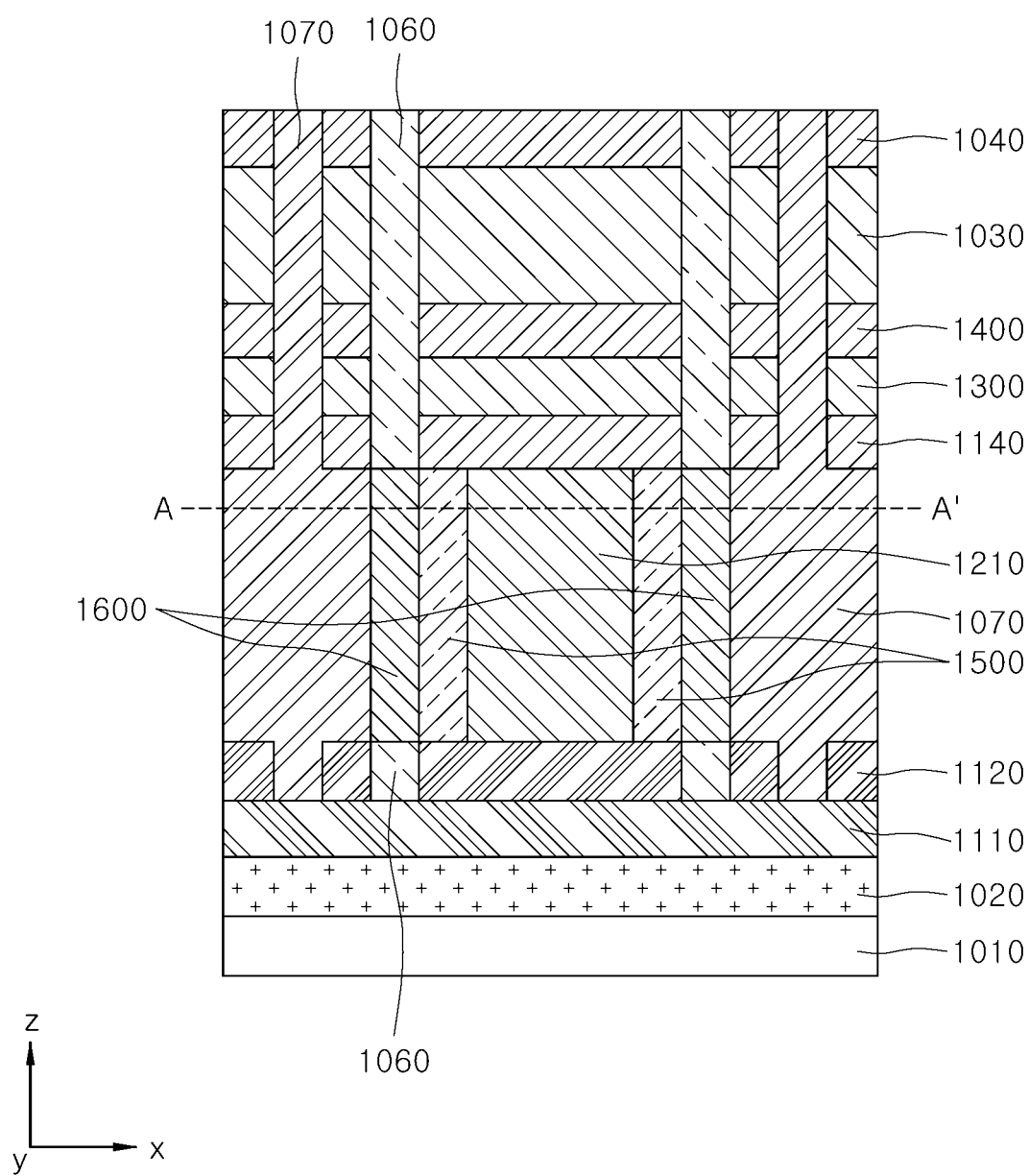

Referring to FIGS. 14A, 14B, and 14C, a third conductive layer 1600 may be formed on the exposed second dielectric layer 1500. The third conductive layer 1600 may extend in the y-direction. The third conductive layer 1600 may correspond to write word lines 140a and 140b of a semiconductor device 2 described above with reference to FIGS. 2A to 2E.

The third conductive layer 1600 may include, for example, a conductive material. The conductive material may include, for example, doped semiconductor, metal, conductive metal nitride, conductive metal carbide, conductive metal silicide, conductive metal oxide, or a combination of two or more thereof. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The third conductive layer 1600 may be formed using, for example, a chemical vapor deposition method or an atomic layer deposition method.

Next, a third interlayer insulation layer 1070 may be formed to fill the second recess spaces R2 and the second trench patterns H2. The third interlayer insulation layer 1070 may include, for example, silicon oxide, silicon nitride, or silicon oxynitride. The third interlayer insulation layer 1070 may be formed by, for example, a chemical vapor deposition method or a coating method.

Figure 15A:
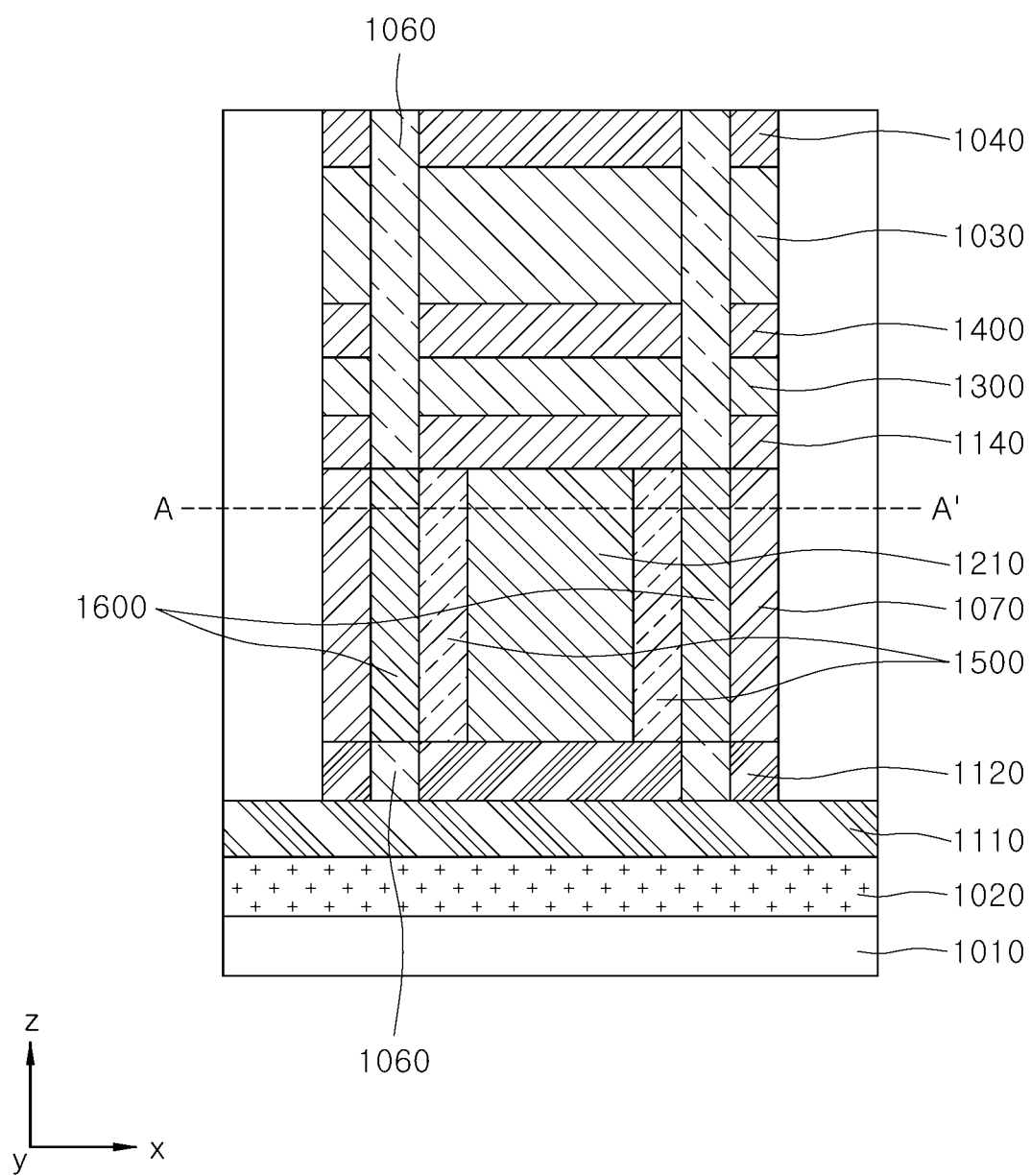
Figure 15B:
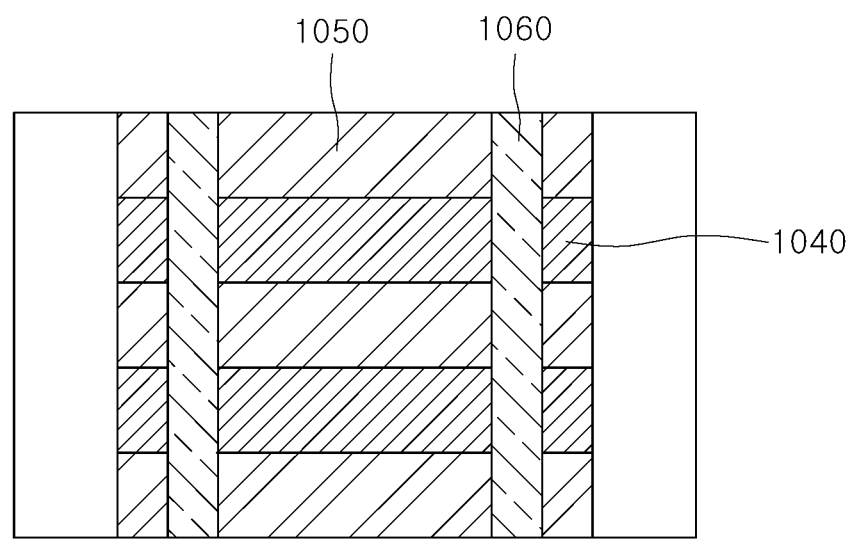
Figure 15C:
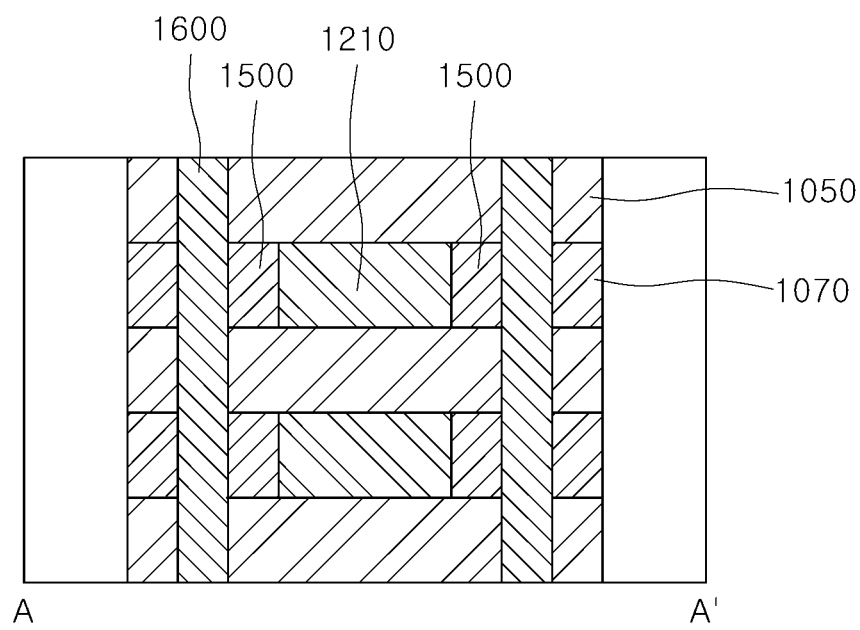
Figure 15C:
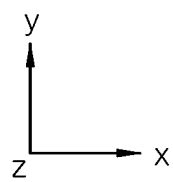

Referring to FIGS. 15A, 15B, and 15C, the resultant structure of FIGS. 14A, 14B, and 14C may be patterned. The patterning process may be performed by sequentially performing anisotropic etching to the protection layer 1040, the sacrificial layer 1030, the first dielectric layer 1400, the second conductive layer 1300, the second contact material layer 1140, the third interlayer insulation layer 1070, and the first contact material layer 1120. As a result of the patterning process, side surfaces of the protection layer 1040, the sacrificial layer 1030, the first dielectric layer 1400, the second conductive layer 1300, the second contact material layer 1140, the third interlayer insulation layer 1070, and the first contact material layer 1120 may be exposed.

Figure 16A:
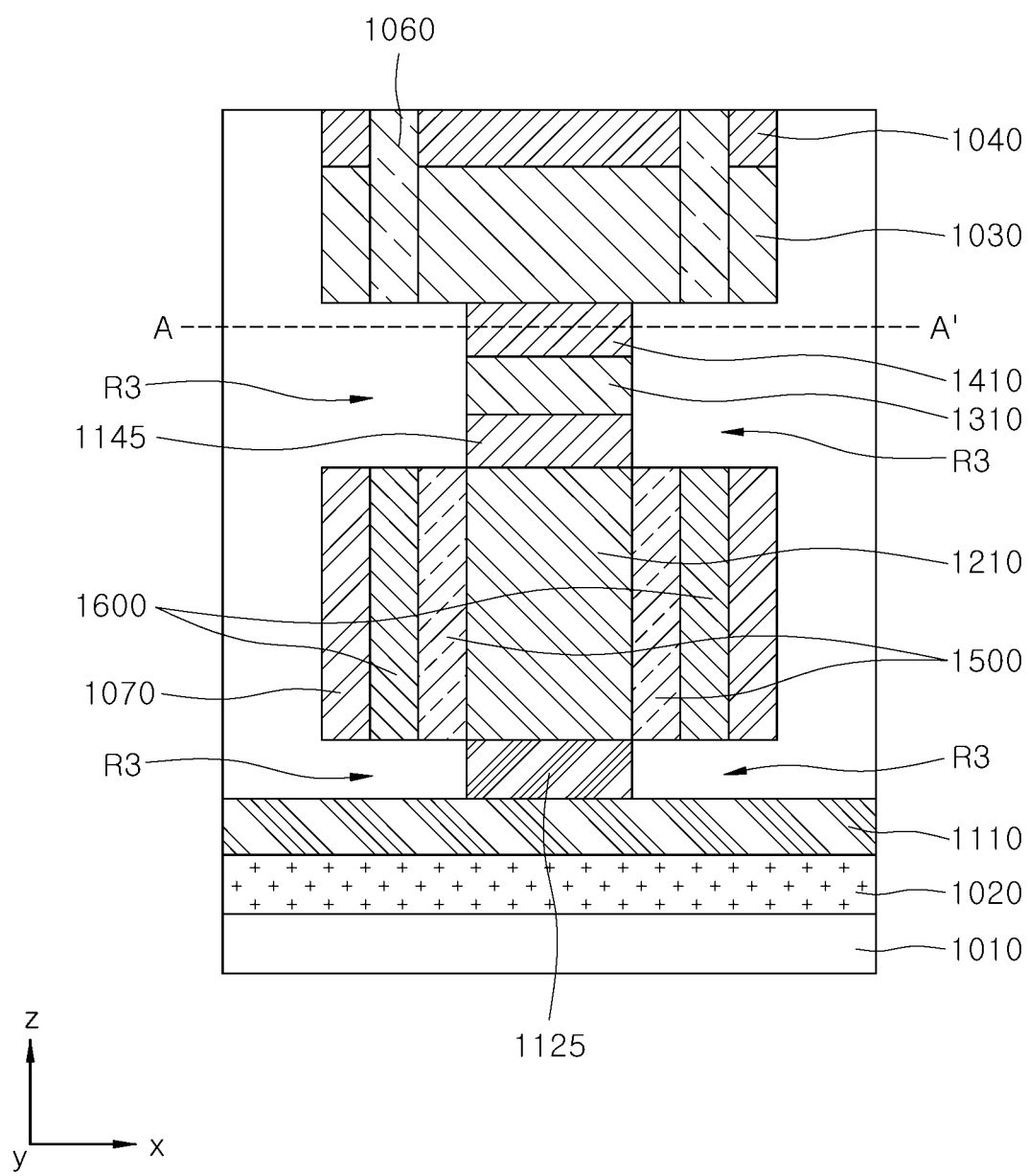
Figure 16B:
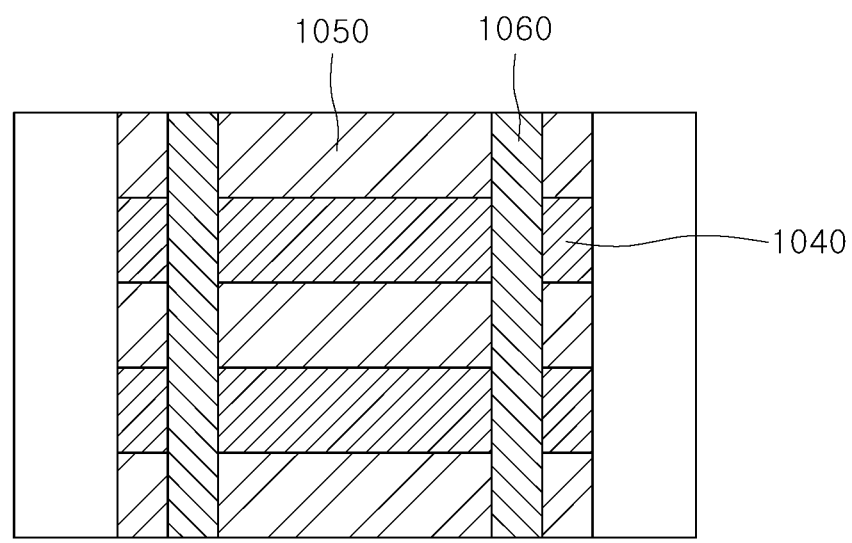
Figure 16C:
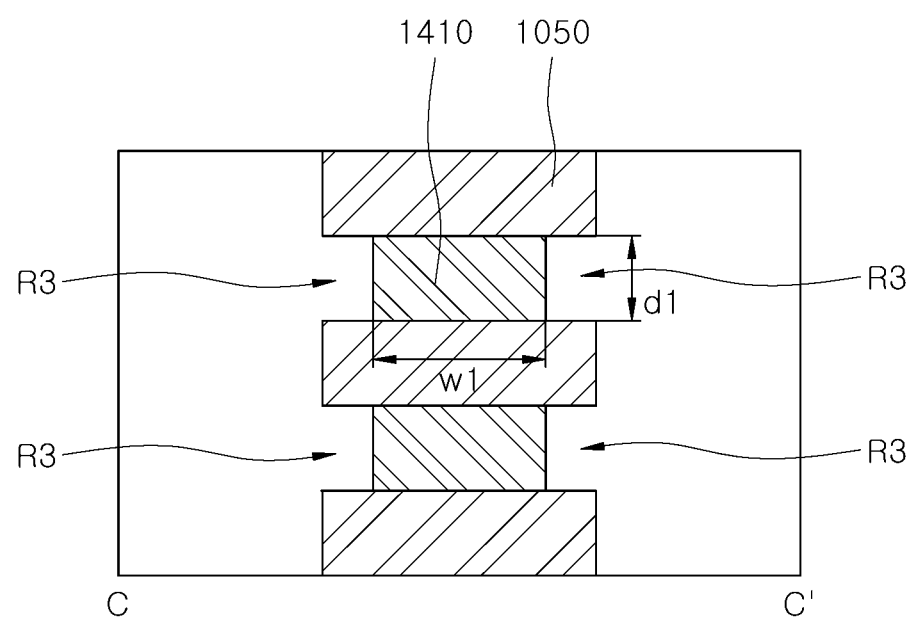
FIGS. 16C and 17C are cross-sectional views illustrating the structures of FIGS. 16A and 17A taken along a line C-C' on an x-y plane.

Referring to FIGS. 16A, 16B, and 16C, exposed side surfaces of the first contact material layer (1120 of FIG. 15A), the second contact material layer (1140 of FIG. 15A), the second conductive layer (1300 of FIG. 15A), and the first dielectric layer (1400 of FIG. 15A) may be selectively etched. In addition, some portions of the second interlayer insulation layer 1060 exposed in the selective etching process may be additionally etched. As a result, third recess spaces R3 may be formed. On x-y planes, the surface area of each of the etched first contact material layer 1120, the second contact material layer 1140, the second conductive layer 1300, and the first dielectric layer 1400 may be substantially the same as the surface area of the write channel structure 1210 on an x-y plane. As a result of the etching process, a first contact layer 1125, a second contact layer 1145, a read gate electrode layer 1310, and a read gate dielectric layer 1410 may be formed respectively from the first contact material layer 1120, the second contact material layer 1140, the second conductive layer 1300, and the first dielectric layer 1400. Each of the first contact layer 1125, the second contact layer 1145, the read gate electrode layer 1310, and the read gate dielectric layer 1410 may have a width w1 in the x-direction and a length d1 in the y-direction. The first contact layer 1125, the second contact layer 1145, the read gate electrode layer 1310, and the read gate dielectric layer 1410 may correspond to a first contact layer 112, a second contact layer 114, a read gate electrode layer 150, and a read gate dielectric layer 160 of the semiconductor device 2 described above with reference to FIGS. 2A to 2E, respectively.

Figure 17A:
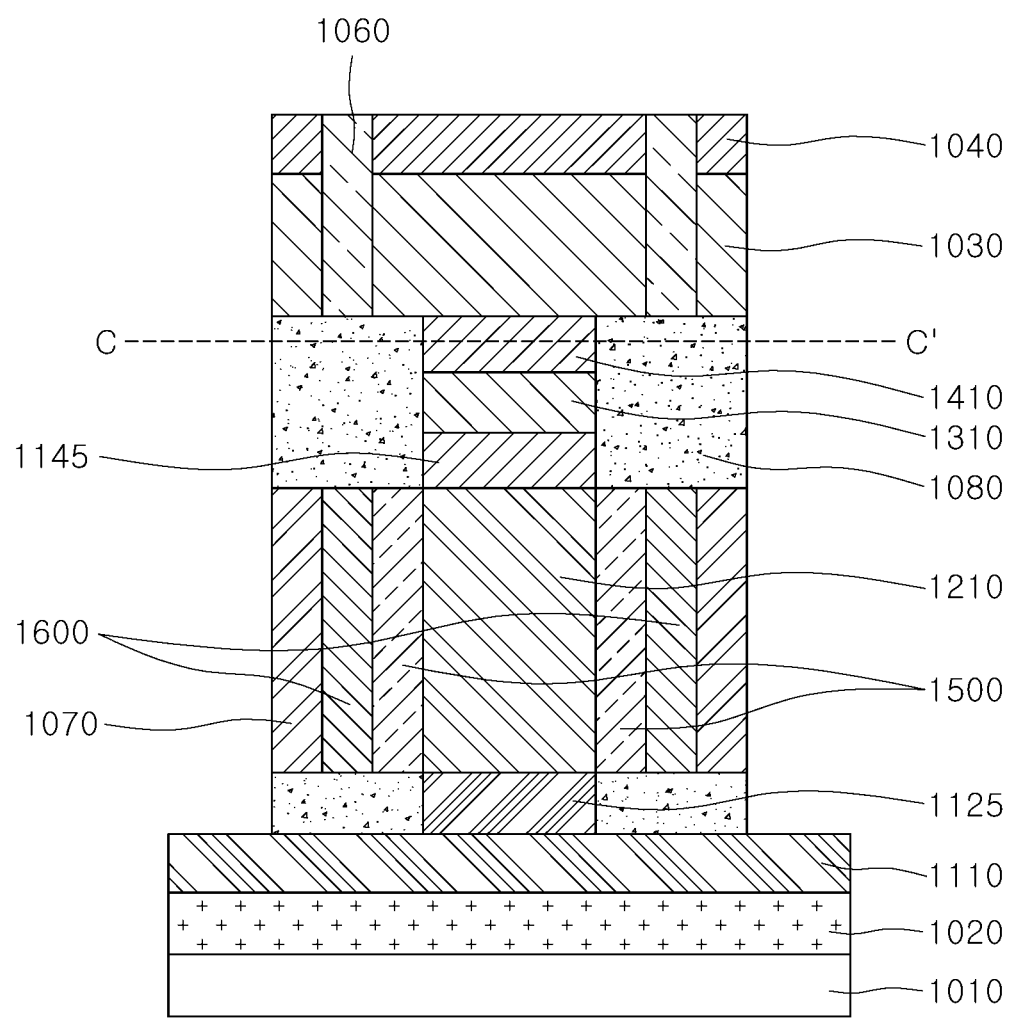
Figure 17B:
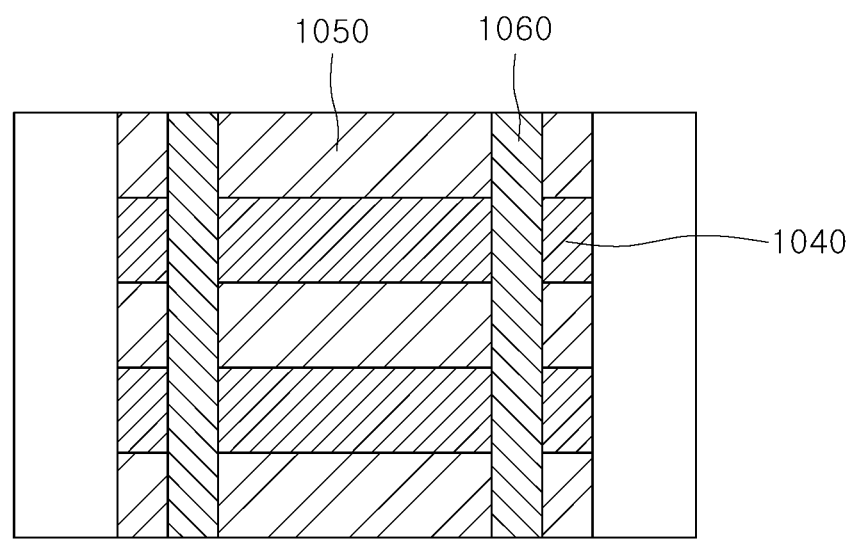
Figure 17C:
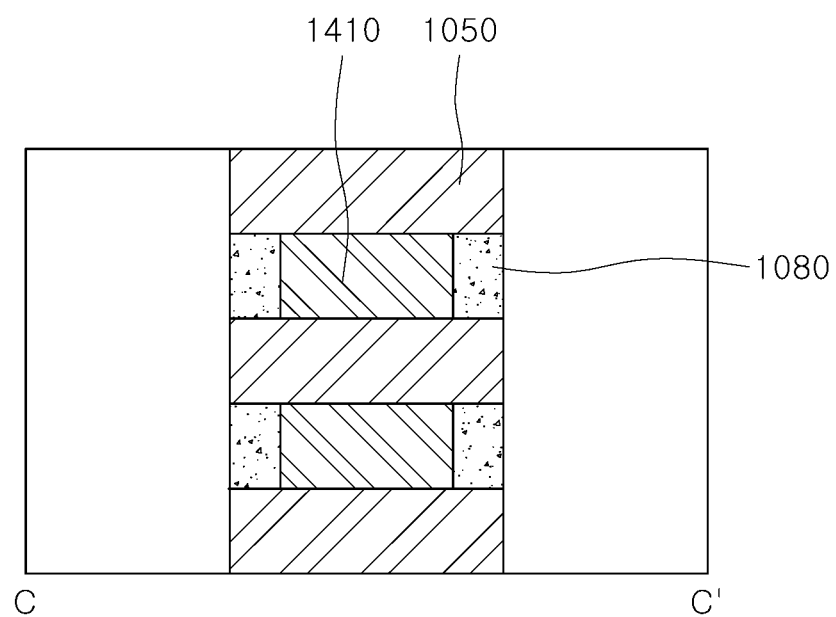

Referring to FIGS. 17A, 17B, and 17C, a fourth interlayer insulation layer 1080 may be formed to fill the third recess spaces (R3 of FIG. 16A). The fourth interlayer insulation layer 1080 may include, for example, silicon oxide, silicon nitride, or silicon oxynitride. The fourth interlayer insulation layer 1080 may be formed by, for example, a chemical vapor deposition method or a coating method.

Figure 18A:
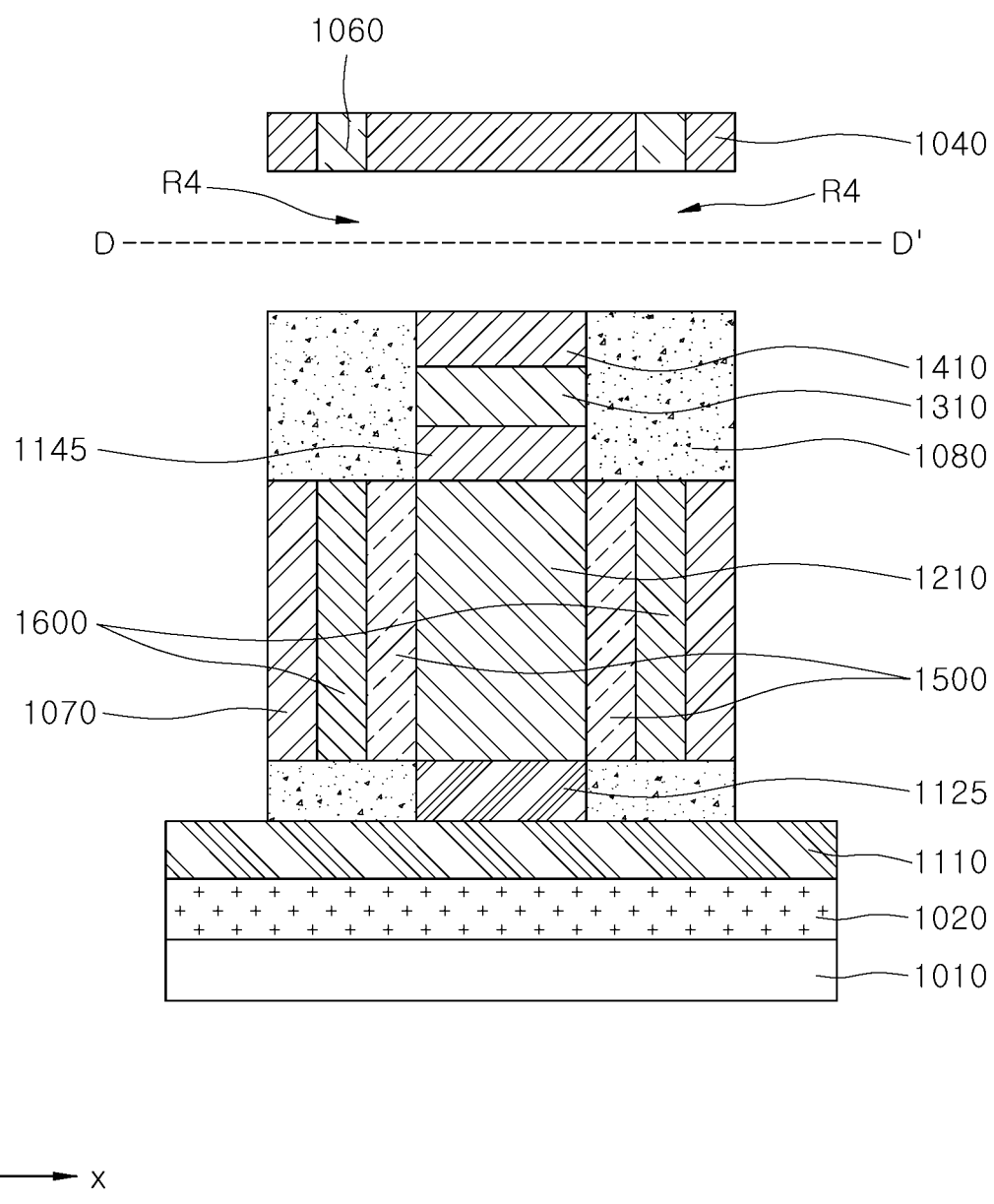
Figure 18B:
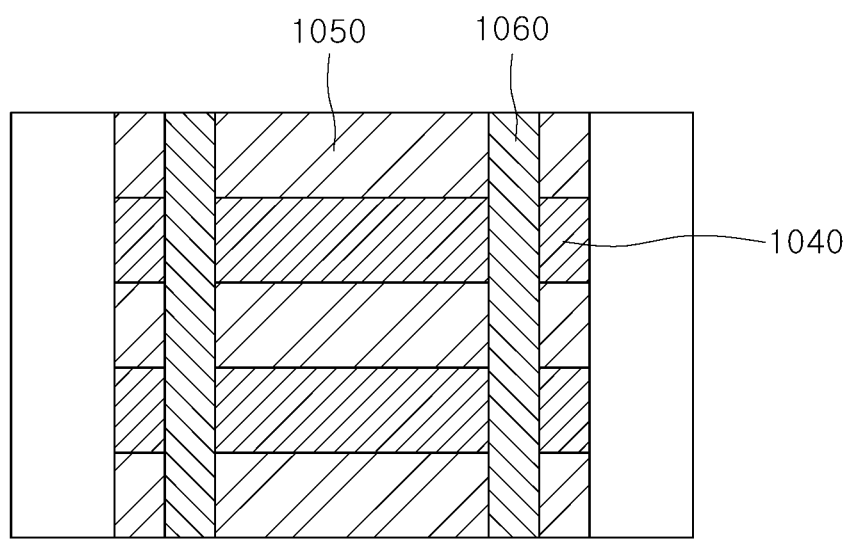
Figure 18C:
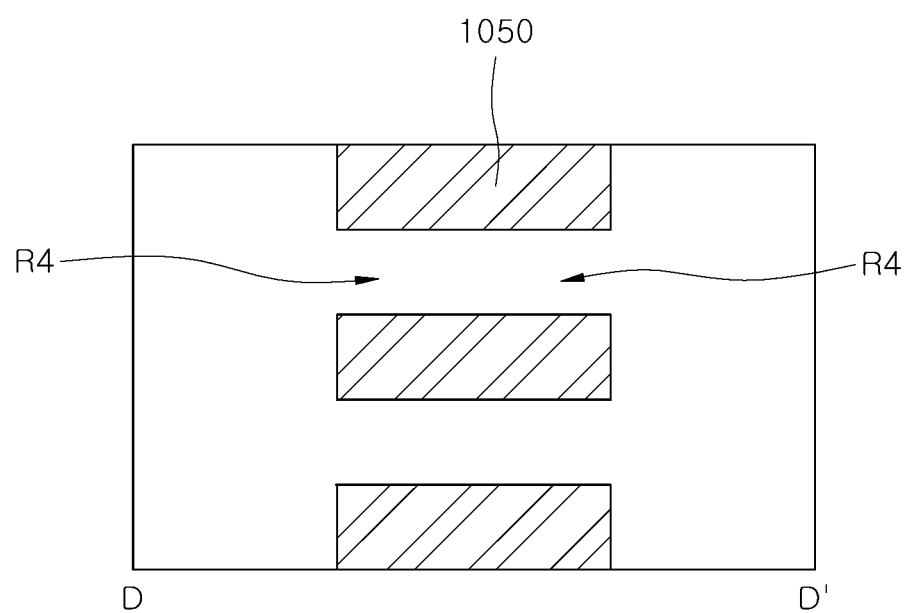

Referring to FIGS. 18A, 18B, and 18C, the sacrificial layer (1030 of FIG. 17A) exposed by the patterning process of FIGS. 15A, 15B, and 15C may be selectively etched. In addition, the second interlayer insulation layer 1060 exposed in the selective etching process may be additionally etched. As a result, a fourth recess space R4 may be formed.

Figure 19A:
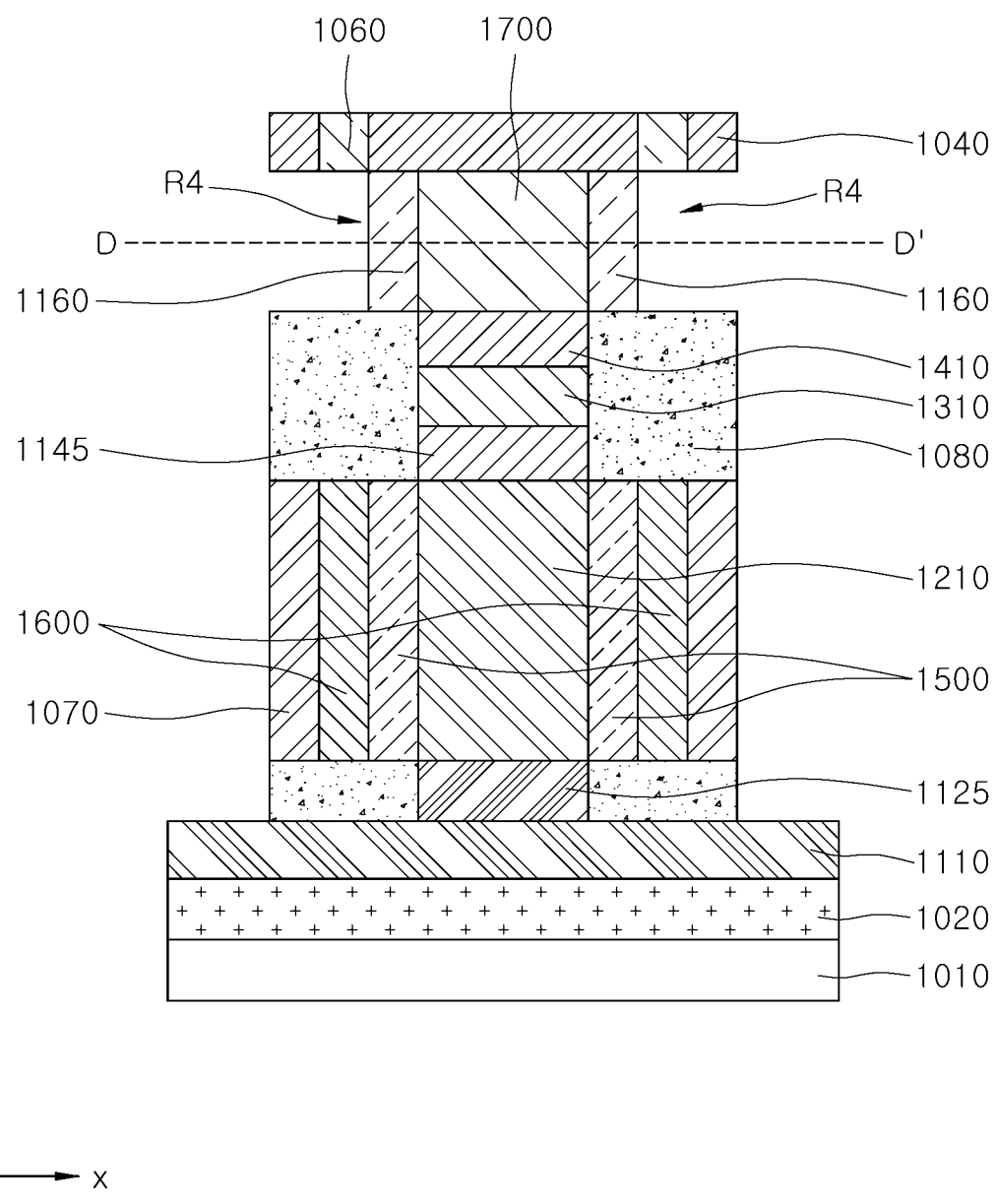
Figure 19B:
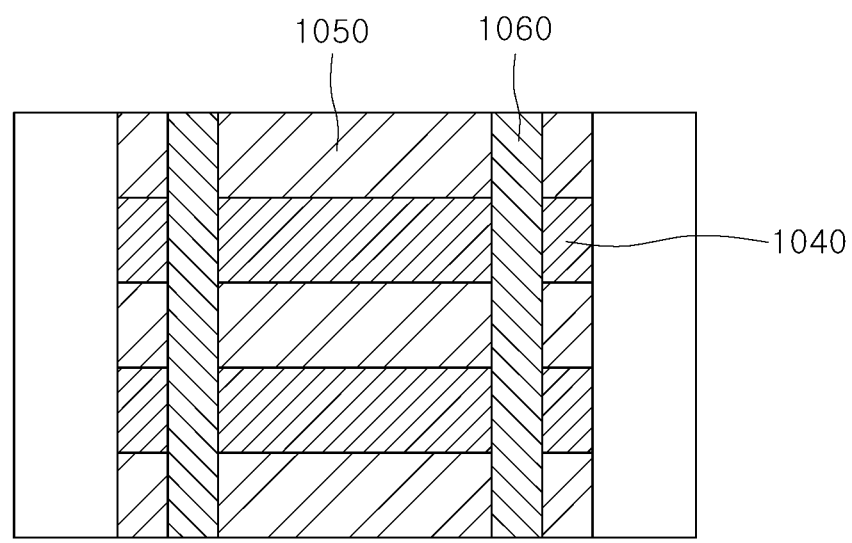
Figure 19C:
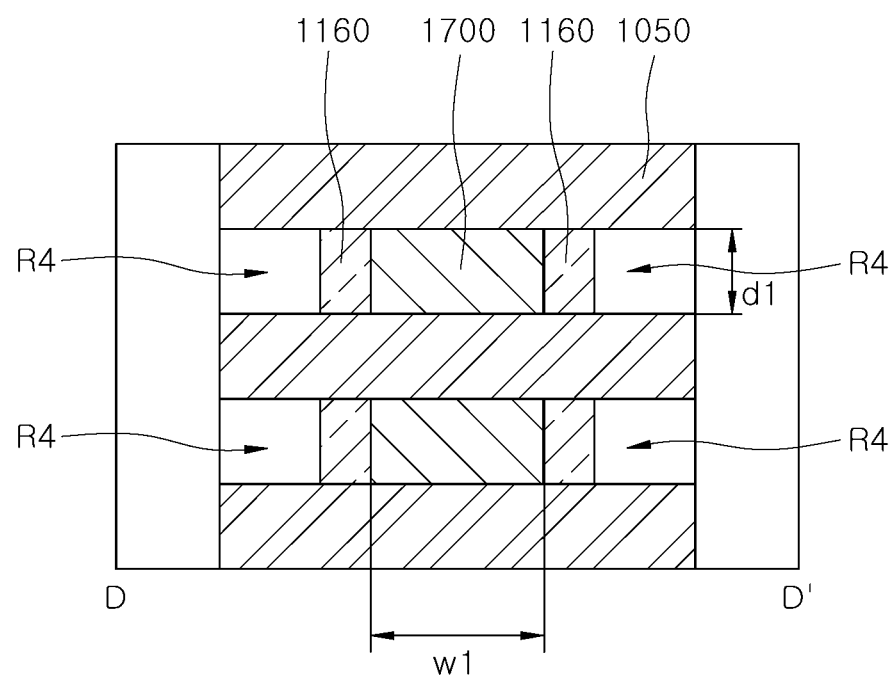

Referring to FIGS. 19A, 19B, and 19C, the fourth recess space R4 may be filled with a second semiconductor layer 1700. Thereafter, the second semiconductor layer 1700 may be partially etched to overlap with the underlying write channel structure 1210 in the z-direction. Accordingly, the etched second semiconductor layer 1700 may have a width w1 in the x-direction and a length d1 in the y-direction. The second semiconductor layer 1700 may correspond to a read channel layer 170 of a semiconductor device 2 described above with reference to FIGS. 2A to 2E.

Next, third contact layers 1160 may be formed at opposite ends of the second semiconductor layer 1700. The third contact layers 1160 may include a conductive material. As an example, the third contact layers 1160 may include metal silicide. As another example, the third contact layers 1160 may include doped conductive metal oxide, doped transition metal chalcogenide, or a combination of two or more thereof. The third contact layers 1160 may include the same material as the second semiconductor layer 1700, but may have a higher concentration of dopant than the second semiconductor layer 1700. Accordingly, the third contact layer 1160s may have higher electrical conductivity than the second semiconductor layer 1700. The third contact layers 1160 may be formed by, for example, a chemical vapor deposition method, an atomic layer deposition method, or a sputtering method. The third contact layers 1160 may correspond to third and fourth contact layers 116 and 118 of a semiconductor device 2 described above with reference to FIGS. 2A to 2E.

Figure 20A:
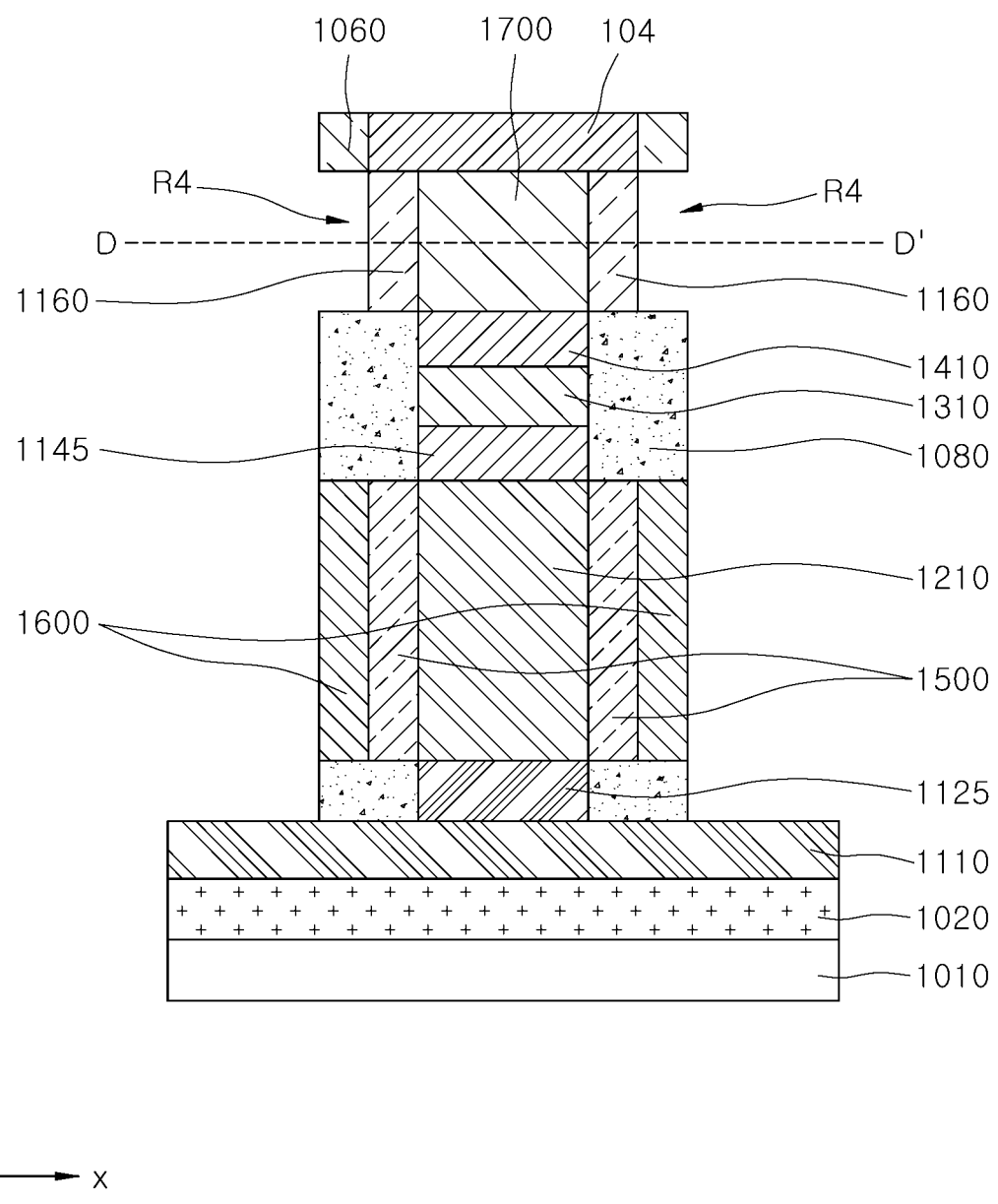
Figure 20B:
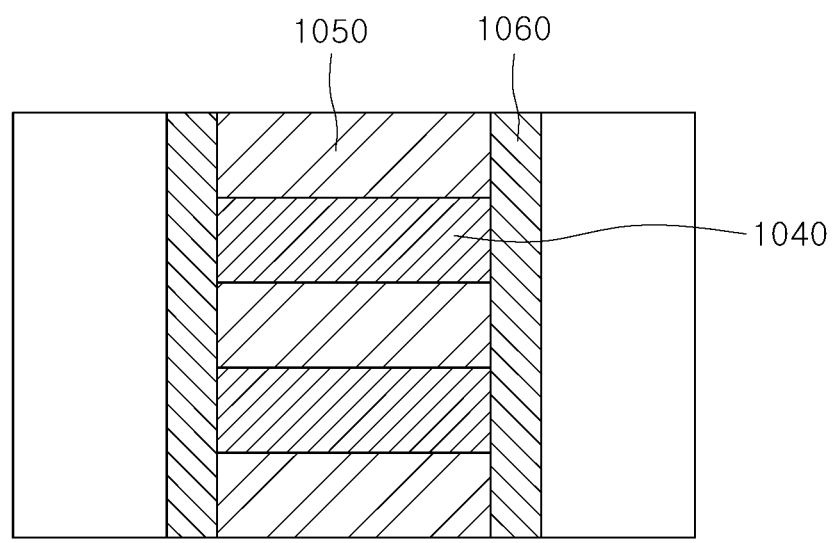
Figure 20C:
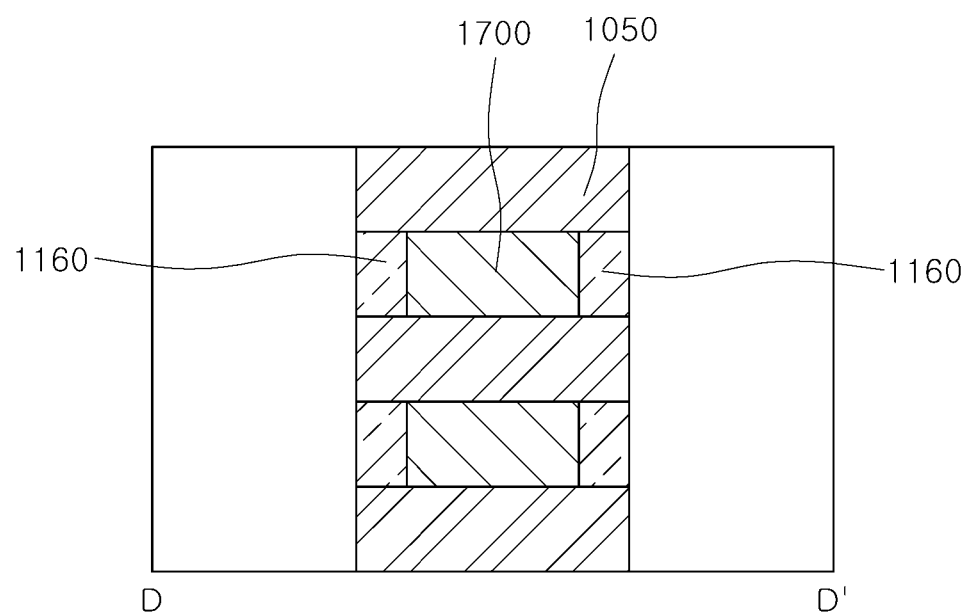

Referring to FIGS. 20A, 20B, and 20C, the first interlayer insulation layer 1050, the third interlayer insulation layer 1070, and the fourth interlayer insulation layer 1080 of the resultant structure of FIGS. 19A, 19B, and 19C may be selectively etched. As a result of the selective etch, as illustrated in FIG. 20C, the first interlayer insulation 1050 and the third contact layer 1160 may be exposed on y-z planes.

Figure 21A:
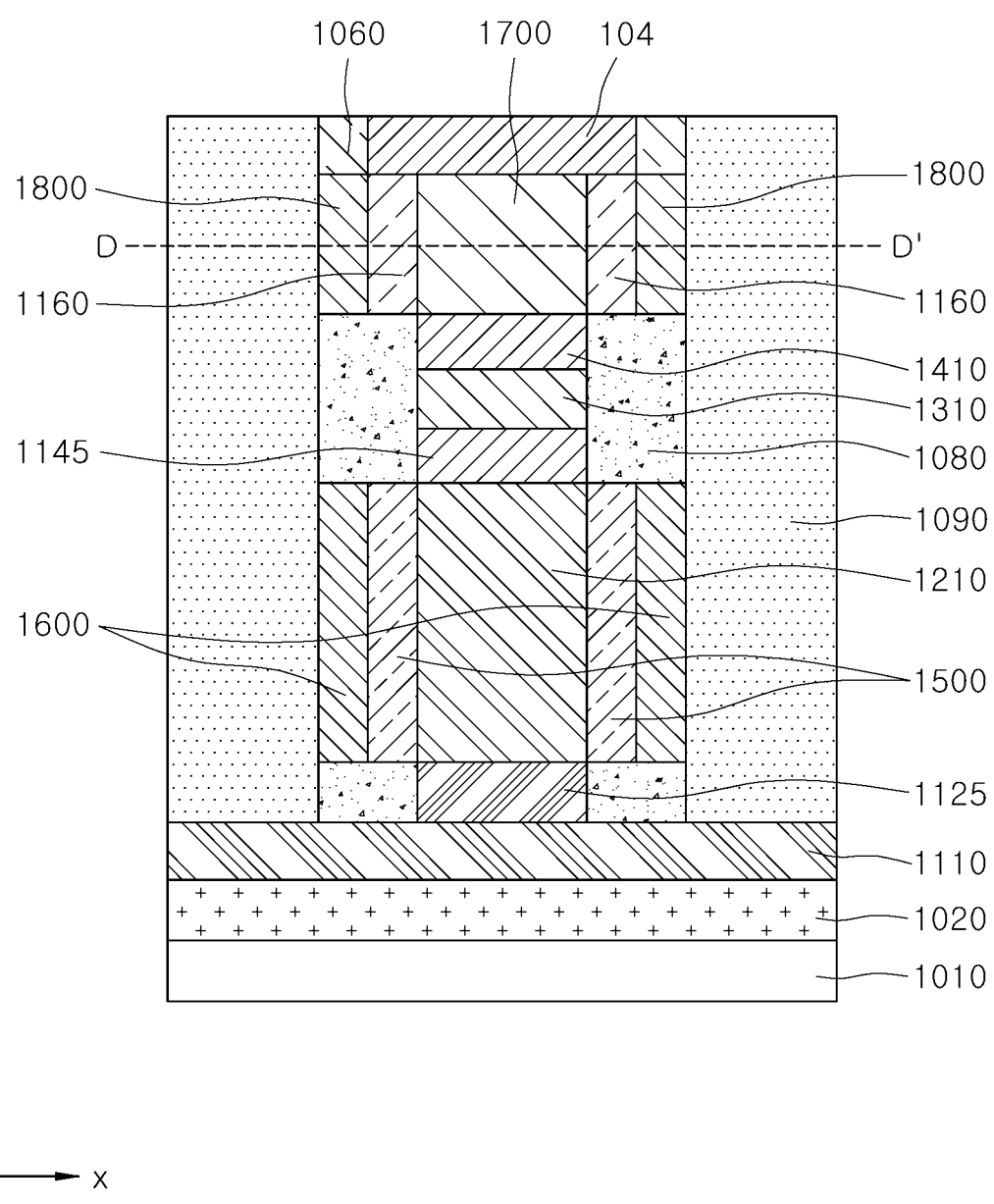
Figure 21B:
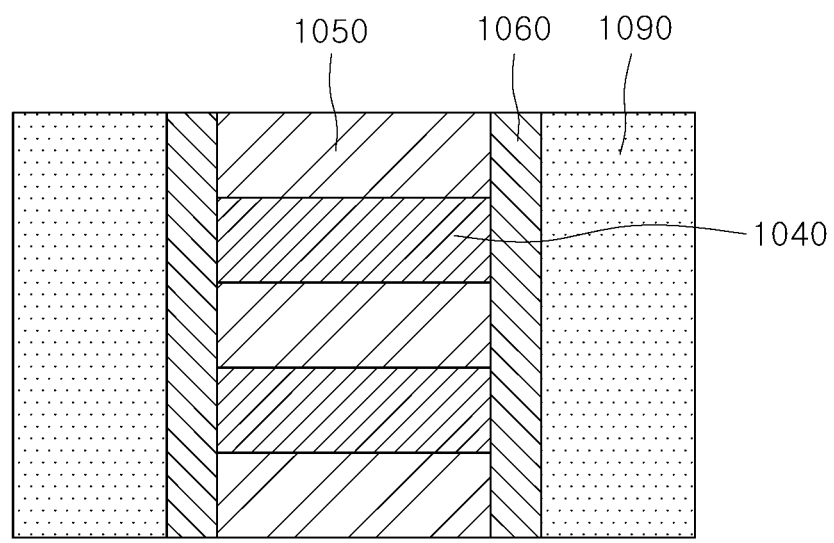
Figure 21C:
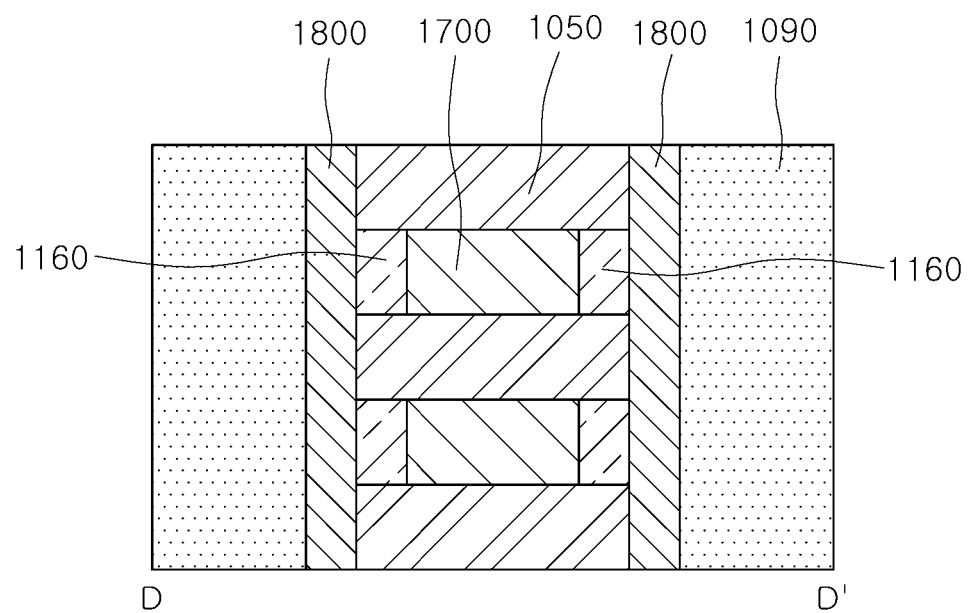

Referring to FIGS. 21A, 21B, and 21C, fourth conductive layers 1800 may be formed to contact the first interlayer insulation layer 1050 and the third contact layers 1160 and to extend in the y-direction. The fourth conductive layers 1800 may be disposed at both ends of the second semiconductor layer 1700. The fourth conductive layers 1800 may correspond to read word line 180 and read bit line 190 of a semiconductor device 2 described above with reference to FIGS. 2A to 2E.

The fourth conductive layer 1800 may include a conductive material. The conductive material may include, for example, doped semiconductor, metal, conductive metal nitride, conductive metal carbide, conductive metal silicide, conductive metal oxide, or a combination of two or more thereof. The conductive material may include, for example, n-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The fourth conductive layer 1800 may be formed, for example, by a chemical vapor deposition method or an atomic layer deposition method.

Next, a fifth interlayer insulation layer 1090 may be formed over the substrate 1010. The fifth interlayer insulation layer 1090 may serve to electrically insulate the conductive layers exposed to outside from each other. The fifth interlayer insulation layer 1090 may include, for example, silicon oxide, silicon nitride, or silicon oxynitride. The fifth interlayer insulation layer 1090 may be formed, for example, by a chemical vapor deposition method or a coating method.

Through the above-described processes, a semiconductor device according to an embodiment of the present disclosure may be manufactured.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a memory cell including a write transistor and a read transistor that are electrically connected to each other,
   wherein the write transistor comprises:
   a write bit line disposed over a substrate and extending in a direction parallel to a surface of the substrate;
   a write channel structure disposed on the write bit line and extending in a direction perpendicular to the surface of the substrate;
   a write gate dielectric layer disposed on a side surface of the write channel structure; and
   a write word line disposed on the write gate dielectric layer, and
   wherein the read transistor comprises:
   a read gate electrode layer disposed on the write channel structure;
   a read gate dielectric layer disposed on the read gate electrode layer;
   a read channel layer disposed on the read gate dielectric layer; and
   a read word line and a read bit line that are disposed at opposite ends of the read channel layer.

2. The semiconductor device of claim 1, further comprising a peripheral circuit that is disposed between the substrate and the write bit line and that controls the memory cell.

3. The semiconductor device of claim 1, wherein the write bit line extends in a first direction parallel to the surface of the substrate,
   wherein the write word line extends in a second direction parallel to the surface of the substrate, and
   wherein the read word line and the read bit line extend in a third direction parallel to the surface of the substrate.

4. The semiconductor device of claim 3, wherein the write word line is disposed to be parallel to the read word line and the read bit line, and
   wherein the write bit line is not parallel to the write word line.

5. The semiconductor device of claim 1, wherein the write channel structure includes a pillar structure.

6. The semiconductor device of claim 1, wherein the write gate dielectric layer is disposed over the substrate to contact opposing outer surfaces of the write channel structure.

7. The semiconductor device of claim 6, wherein the write word line is disposed to contact the write gate dielectric layer and to be spaced apart from the write channel structure.

8. The semiconductor device of claim 1, wherein the write gate dielectric layer is disposed over the substrate to surround an outer surface of the write channel structure.

9. The semiconductor device of claim 8, wherein the write word line is disposed on the write gate dielectric layer and extends in a direction parallel to the surface of the substrate.

10. The semiconductor device of claim 1, further comprising:
    a first contact layer disposed between the write bit line and the write channel structure;
    a second contact layer disposed between the write channel structure and the read gate electrode layer;

a third contact layer disposed between the read word line and the read channel layer; and a fourth contact layer disposed between the read bit line and the read channel layer.

11. The semiconductor device of claim 1, wherein each of the write channel structure and the read channel layer comprises at least one selected from semiconductor, conductive metal oxide, and transition metal chalcogenide.

12. The semiconductor device of claim 1, wherein a cross-sectional area of the write channel structure in a plane parallel to the surface of the substrate is substantially the same as a surface area of the read gate electrode layer in a plane parallel to the surface of the substrate.

13. The semiconductor device of claim 1, wherein the write channel structure is electrically connected to the read gate electrode layer.

14. The semiconductor device of claim 1, wherein the read channel layer, the read word line, and the read bit line are disposed on the same plane.

15. The semiconductor device of claim 1, wherein the write channel structure, the read gate electrode layer, the read gate dielectric layer, and the read channel layer are disposed to overlap with each other along a direction perpendicular to the surface of the substrate.

16. A semiconductor device comprising:
a first memory cell including a write transistor and a read transistor; and
a second memory cell including a write transistor and a read transistor,
wherein each of the write transistors of the first and second memory cells comprises:
a write bit line disposed over a substrate and extending in a direction parallel to a surface of the substrate;
a write channel structure disposed on the write bit line and extending in a direction perpendicular to the surface of the substrate;
a write gate dielectric layer disposed on a side surface of the write channel structure; and
a write word line disposed on the write gate dielectric layer,
wherein each of the read transistors of the first and second memory cells comprises:
a read gate electrode layer disposed on the write channel structure;
a read gate dielectric layer disposed on the read gate electrode layer;
a read channel layer disposed on the read gate dielectric layer; and a read word line and a read bit line that are disposed at opposite ends of the read channel layer; and
wherein the second memory cell is disposed over the first memory cell with respect to a surface of a substrate.

17. A method of manufacturing a semiconductor device, the method comprising:
forming a write bit line over a substrate, the write bit line extending in a first direction parallel to a surface of the substrate;
forming a write channel structure over the write bit line, the write channel structure extending in a second direction perpendicular to the surface of the substrate;
forming a write gate dielectric layer disposed on a side surface of the write channel structure;
forming a write word line disposed on the write gate dielectric layer and extending in a third direction parallel to the surface of the substrate;
forming a read gate electrode layer, a read gate dielectric layer, and a read channel layer on an upper surface of the write channel structure; and forming a read word line and a read bit line at opposing ends of the read channel layer, the read word line and the read bit line extending in a fourth direction parallel to the surface of the substrate.

18. The method of claim 17, wherein forming the write channel structure comprises forming a pillar structure that is electrically connected to the write bit line.

19. The method of claim 17, wherein forming the write gate dielectric layer comprises forming a dielectric layer over the substrate in contact with opposite outer surfaces of the write channel structure.

20. The method of claim 17, wherein forming the write gate dielectric layer comprises forming a dielectric layer over the substrate that surrounds outer surfaces of the write channel structure.

21. The method of claim 17, further comprising:
forming a first contact layer between the write bit line and the write channel structure;
forming a second contact layer between the write channel structure and the read gate electrode layer;
forming a third contact layer between the read word line and the read channel layer; and
forming a fourth contact layer between the read bit line and the read channel layer.

22. The method of claim 17, wherein forming the read gate electrode layer comprises forming the read gate electrode layer to have a surface area substantially equal to a cross-sectional area perpendicular to the second direction of the write channel structure.

23. A semiconductor device comprising:
a substrate; and
a memory cell including a write transistor and a read transistor disposed over the substrate,
wherein the write transistor comprises:
a write bit line extending in a first direction parallel to a surface of the substrate;
a write channel structure extending in a second direction perpendicular to the surface of the substrate on the write bit line;
a write gate dielectric layer disposed on a side surface of the write channel structure; and
a write word line disposed to contact the write gate dielectric layer and extending in a third direction parallel to the surface of the substrate,
wherein the read transistor comprises:
a read gate electrode layer disposed over the write channel structure to be electrically connected to the write channel structure;
a read gate dielectric layer disposed on the read gate electrode layer;
a read channel layer disposed on the read gate dielectric layer; and
a read word line and a read bit line that are respectively disposed at opposite ends of the read channel layer and that extend in a fourth direction parallel to the surface of the substrate,
wherein the fourth direction is parallel to the first direction or the third direction, and
wherein the write channel structure, the read gate electrode layer, the read gate dielectric layer, and the read channel layer are disposed to overlap with each other along the second direction.

24. The semiconductor device of claim 23, further comprising a peripheral circuit disposed between the substrate and the write bit line to control the memory cell.

25. The semiconductor device of claim 23, wherein the read channel layer, the read word line, and the read bit line are disposed on the same plane.

26. The semiconductor device of claim 23, wherein the write gate dielectric layer is disposed to contact opposing outer surfaces of the write channel structure over the substrate, and
wherein the write word line is disposed to be in contact with the write gate dielectric layer and to be spaced apart from the write channel structure.

27. The semiconductor device of claim 23, wherein the write gate dielectric layer is disposed over the substrate to surround an outer surface of the write channel structure, and
wherein the write word line is disposed to surround the write gate dielectric layer and to extend in a direction parallel to the surface of the substrate.

* * * * *